(12) United States Patent
Jeon et al.

(10) Patent No.: US 10,600,458 B2
(45) Date of Patent: Mar. 24, 2020

(54) MEMORY DEVICE AND METHOD OF OPERATING THE SAME FOR LATENCY CONTROL

(71) Applicant: SAMSUNG ELECTRONICS CO., LTD., Suwon-si, Gyeonggi-do (KR)

(72) Inventors: Ju-Ho Jeon, Bucheon-si (KR); Han-Gi Jung, Hwaseong-si (KR); Hun-Dae Choi, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/105,368

(22) Filed: Aug. 20, 2018

(65) Prior Publication Data

US 2019/0147927 A1 May 16, 2019

(30) Foreign Application Priority Data

Nov. 10, 2017 (KR) .......................... 10-2017-0149883

(51) Int. Cl.
| | | |
|---|---|---|
| *G11C 7/00* | (2006.01) | |
| *G11C 7/22* | (2006.01) | |
| *H03L 7/081* | (2006.01) | |
| *H03L 7/08* | (2006.01) | |
| *G11C 29/50* | (2006.01) | |
| *H03K 21/02* | (2006.01) | |
| *G11C 29/02* | (2006.01) | |

(52) U.S. Cl.
CPC ............ *G11C 7/222* (2013.01); *G11C 29/023* (2013.01); *G11C 29/50012* (2013.01); *H03K 21/02* (2013.01); *H03L 7/0802* (2013.01); *H03L 7/0812* (2013.01); *G11C 2207/2272* (2013.01)

(58) Field of Classification Search
CPC .... G11C 8/00; G11C 7/00; G11C 8/18; H03L 7/00; H03L 7/06; H03L 7/081; H03L 7/089; H03L 7/099; H03L 7/10
USPC ........... 365/194, 191, 233.11, 233.12, 233.5, 365/210.1, 233.15
See application file for complete search history.

(56) References Cited

U.S. PATENT DOCUMENTS

| | | |
|---|---|---|
| 8,035,412 B2 | 10/2011 | Choo et al. |
| 8,363,508 B2 | 1/2013 | Fujisawa |
| 8,576,645 B2 | 11/2013 | Kim |
| 8,928,349 B2 | 1/2015 | Oh et al. |

(Continued)

FOREIGN PATENT DOCUMENTS

| | | |
|---|---|---|
| KR | 10-2015-0064172 | 6/2015 |
| KR | 10-2017-0008861 | 1/2017 |

*Primary Examiner* — Thong Q Le
(74) *Attorney, Agent, or Firm* — F. Chau & Associates, LLC

(57) ABSTRACT

A memory device and method of operation for latency control in which a source clock signal having a first frequency is divided to provide a divided clock signal having a second frequency that is less than the first frequency as an input to a delay-locked loop circuit in an initialization mode. A locking operation may be performed to align the divided clock signal and a feedback clock signal that is generated by delaying the divided clock signal through the delay-locked loop circuit. A loop delay of the delay-locked loop circuit is measured after the locking operation is completed. The latency control is performed efficiently by measuring the loop delay using the divided clock signal in the initialization mode.

20 Claims, 20 Drawing Sheets

(56) References Cited

U.S. PATENT DOCUMENTS

| | | |
|---|---|---|
| 2013/0094321 A1 | 4/2013 | Shido et al. |
| 2014/0015575 A1 | 1/2014 | Jung |
| 2015/0235691 A1 | 8/2015 | Kwak |
| 2015/0263739 A1 | 9/2015 | Jung et al. |
| 2015/0279444 A1 | 10/2015 | Vergis et al. |
| 2017/0125076 A1 | 5/2017 | Jung |
| 2017/0194962 A1* | 7/2017 | Bains et al. |
| 2019/0074841 A1* | 3/2019 | Satoh .................. H03L 7/0992 |

* cited by examiner

|  | MD | FHF | DVSEL |
|---|---|---|---|
| INITIALIZATION MODE | H | H | H |
|  | H | L | L |
| NORMAL OPERATION MODE | L | H | L |
|  | L | L | L |

FIG. 9

| DVSEL | LPDEL(M) |
|---|---|
| H | M=2N |
| L | M=N |

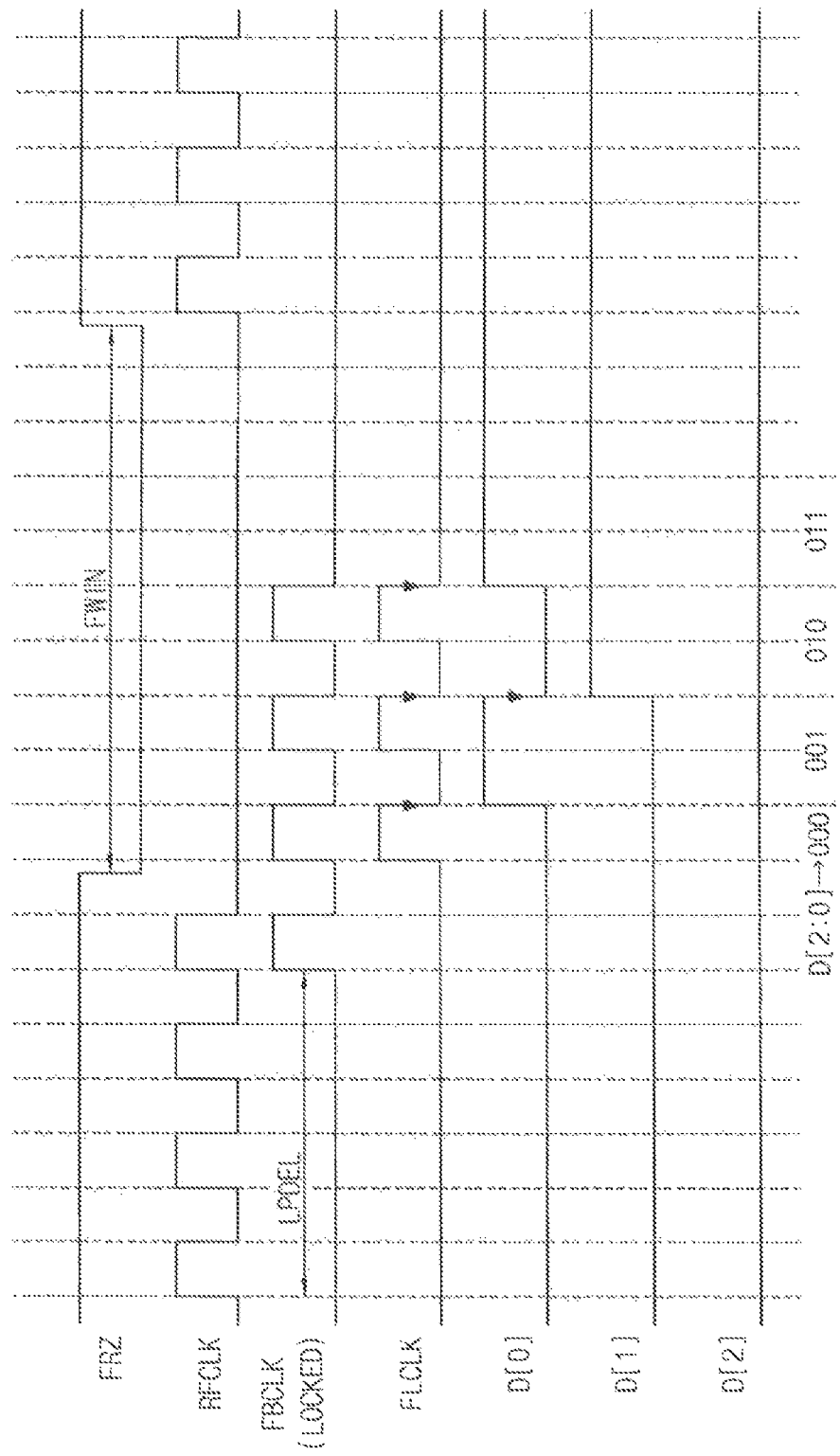

| DVSEL | PINV | LPDEL(M) |
|---|---|---|
| H | H | M=2N±1 |
| H | L | M=2N |
| L | DC | M=N |

MEMORY DEVICE AND METHOD OF OPERATING THE SAME FOR LATENCY CONTROL

CROSS-REFERENCE TO RELATED APPLICATION(S)

This U.S. non-provisional application claims priority under 35 USC § 119 from Korean Patent Application No. 10-2017-0149883, filed on Nov. 10, 2017, in the Korean Intellectual Property Office (KIPO), the disclosure of which is incorporated by reference herein in its entirety.

1. TECHNICAL FIELD

Example embodiments of the inventive concept generally relate to semiconductor integrated circuits. More particularly, embodiments of the inventive concept generally relate to use of a clock signal in various modes of a memory device, and a method of operating the memory device for latency control.

2. DISCUSSION OF THE RELATED ART

In general, a clock signal may be used to synchronize operation timings of a semiconductor device. When an external clock signal from an external source is applied in the semiconductor device, a delay or a clock skew may be caused in an internal clock signal of the semiconductor device due to various internal circuits. A delay-locked loop circuit may be used to adjust the delay by synchronizing the internal clock signal with the external clock signal. Most synchronous memory devices (e.g., a synchronous dynamic random access memory (SDRAM)) include the delay-locked loop circuit because a read latency scheme and an on-die termination scheme utilize a clock synchronization scheme. For example, a latency control of a command provided from an external device is utilized in synchronous memory devices to synchronize the command with a delay-locked clock signal generated by the delay-locked loop circuit.

SUMMARY

Some example embodiments of the inventive concept may provide a memory device capable of performing a latency control efficiently.

Some example embodiments of the inventive concept may provide a method of operating a memory device that performs a latency control efficiently.

According to example embodiments of the inventive concept, a method of operating a memory device includes, dividing a source clock signal having a first frequency into a divided clock signal for input to a delay-locked loop circuit in an initialization mode, the divided clock signal having a second frequency less than the first frequency of the source clock signal; aligning the divided clock signal and a feedback clock signal by performing a locking operation, wherein the feedback clock signal is generated by delaying the divided clock signal through the delay-locked loop circuit; and measuring a loop delay of the delay-locked loop circuit after performing the locking operation, the loop delay corresponding to a delay of the feedback clock signal with respect to the divided clock signal. According to example embodiments of the inventive concept, the method of operating a memory device further includes, controlling a delay of a command path of the memory device based on a command latency, the source clock signal, the divided clock signal and the loop delay in a normal operation mode.

According to example embodiments of the inventive concept, an operation margin for measuring the loop delay of the delay-locked loop circuit increases when a frequency of the divided clock signal decreases.

According to example embodiments of the inventive concept, a memory device includes a delay-locked loop circuit configured to generate a feedback clock signal and a locked-delayed clock signal by delaying a reference clock signal, a clock divider configured to divide a source clock signal having a first frequency to generate a divided clock signal having a second frequency that is less than the first frequency, a clock selector configured to provide the divided clock signal as the reference clock signal in an initialization mode and provide the source clock signal as the reference clock signal in a normal operation mode and a delay measurement circuit configured to measure a loop delay of the delay-locked loop circuit after a locking operation of the delay-locked loop circuit is completed in the initialization mode, the loop delay corresponding to a delay of the feedback signal with respect to the divided clock signal.

The memory device and the method of operating the memory device according to example embodiments of the inventive concept may perform the latency control efficiently by measuring the loop delay using the divided clock signal in the initialization mode.

The memory device and the method of operating the memory device according to example embodiments of the inventive concept may reduce a size and power consumption of the delay circuit for the latency control by implementing a delay of the command path using the divided clock signal.

BRIEF DESCRIPTION OF THE DRAWINGS

Example embodiments of the inventive concept will be better appreciated by a person of ordinary skill in the art from the following detailed description taken in conjunction with the accompanying drawings.

FIG. 9 is a diagram describing an operation of a calculator included in the delay measurement circuit of FIG. 7;

FIG. 12 is a timing diagram illustrating an example operation of the counter of FIG. 10;

DETAILED DESCRIPTION OF THE EMBODIMENTS

Figure 1:
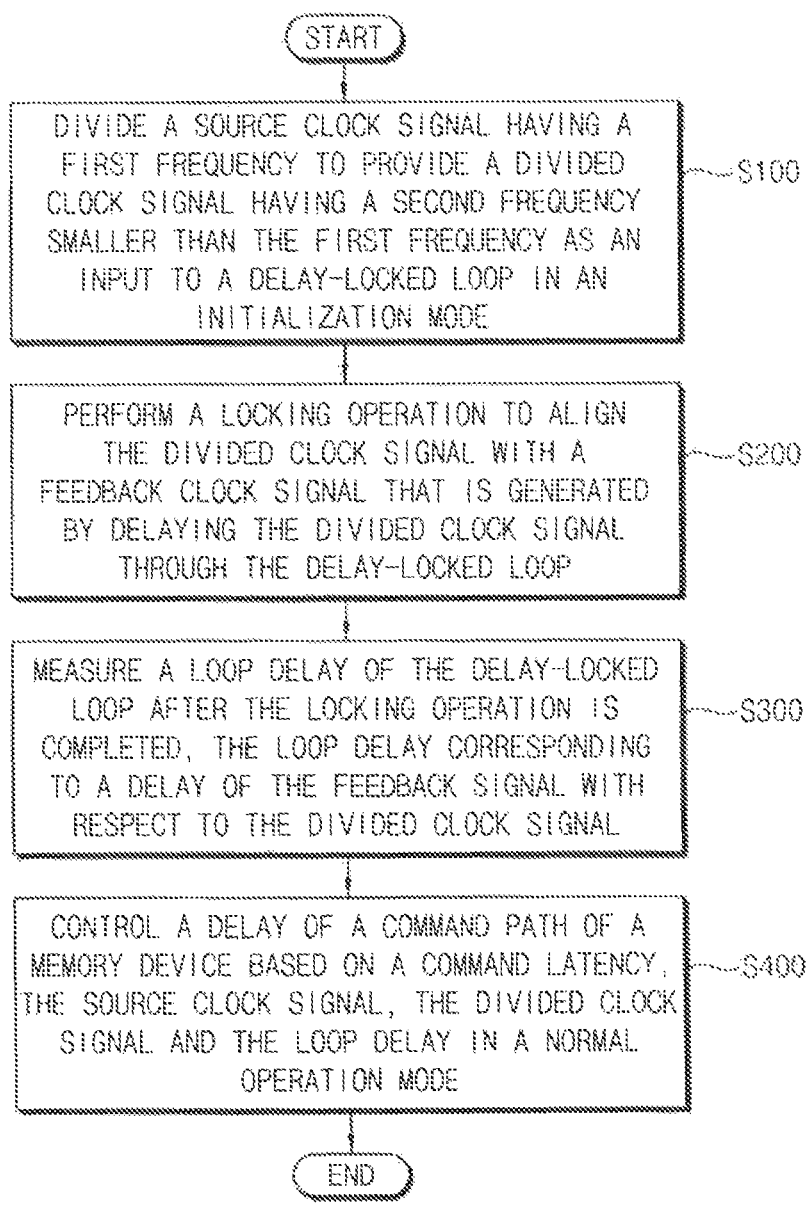
FIG. 1 is a flow chart illustrating a method of operating a memory device according to example embodiments of the inventive concept.

Various example embodiments of the inventive concept will be described more fully hereinafter with reference to the accompanying drawings, in which some example embodiments are shown. In the drawings, like numerals refer to like elements throughout. Repeat descriptions of like elements may be omitted.

FIG. 1 is a flow chart illustrating a method of operating a memory device according to example embodiments of the inventive concept.

Referring now to FIG. 1, at operation (S100), a source clock signal having a first frequency is divided to provide a divided clock signal having a second frequency less than the first frequency as an input to a delay-locked loop circuit in an initialization mode. In a non-limiting example, the divided clock signal may have a second frequency that is ½ the first frequency (e.g. one cycle of the second frequency for every two cycles of the first frequency). However, a person of ordinary skill in the art should understand and appreciate that the second frequency could be divided to be, for example, to ⅓rd of the first frequency, or ¼th of the first frequency or ⅛th, etc.

At operation (S200), a locking operation is performed to align the divided clock signal and a feedback clock signal that is generated by delaying the divided clock signal through the delay-locked loop. For example, the divided clock signal and the feedback clock signal may have their respective rising edge aligned.

At operation (S300), a loop delay of the delay-locked loop circuit is measured after the locking operation is completed, in which the loop delay corresponds to a delay of the feedback signal with respect to the divided clock signal.

The initialization mode for setting operational conditions of a memory device is differentiated from a normal operation mode for performing access operations of the memory device. For example, the initialization mode is performed regardless of a command provided from a memory controller. An artisan should understand and appreciate, for example, that the initialization mode may be implemented as a part of a power-on sequence of the memory device. The initialization mode may also occur, for example, in the event a particular application is being activated, For example, operation of a particular application may be enhanced with a particular logical configuration of the memory, and thus the memory may be initialized, (e.g., re-initialized) for a configuration that is different than an initialization that occurs during a basic power-on sequence.

Accordingly, the memory device and the method of operating the memory device according to example embodiments of the inventive concept may perform the latency control more efficiently by measuring the loop delay using the divided clock signal in the initialization mode.

At operation (S400), a delay of a command path of the memory device may be controlled based on a command latency, the source clock signal, the divided clock signal and the loop delay in a normal operation mode.

Accordingly, the memory device and the method of operating the memory device according to example embodiments of the inventive concept may reduce a size and power consumption of the delay circuit for the latency control by implementing a delay of the command path using the divided clock signal.

Figure 2:
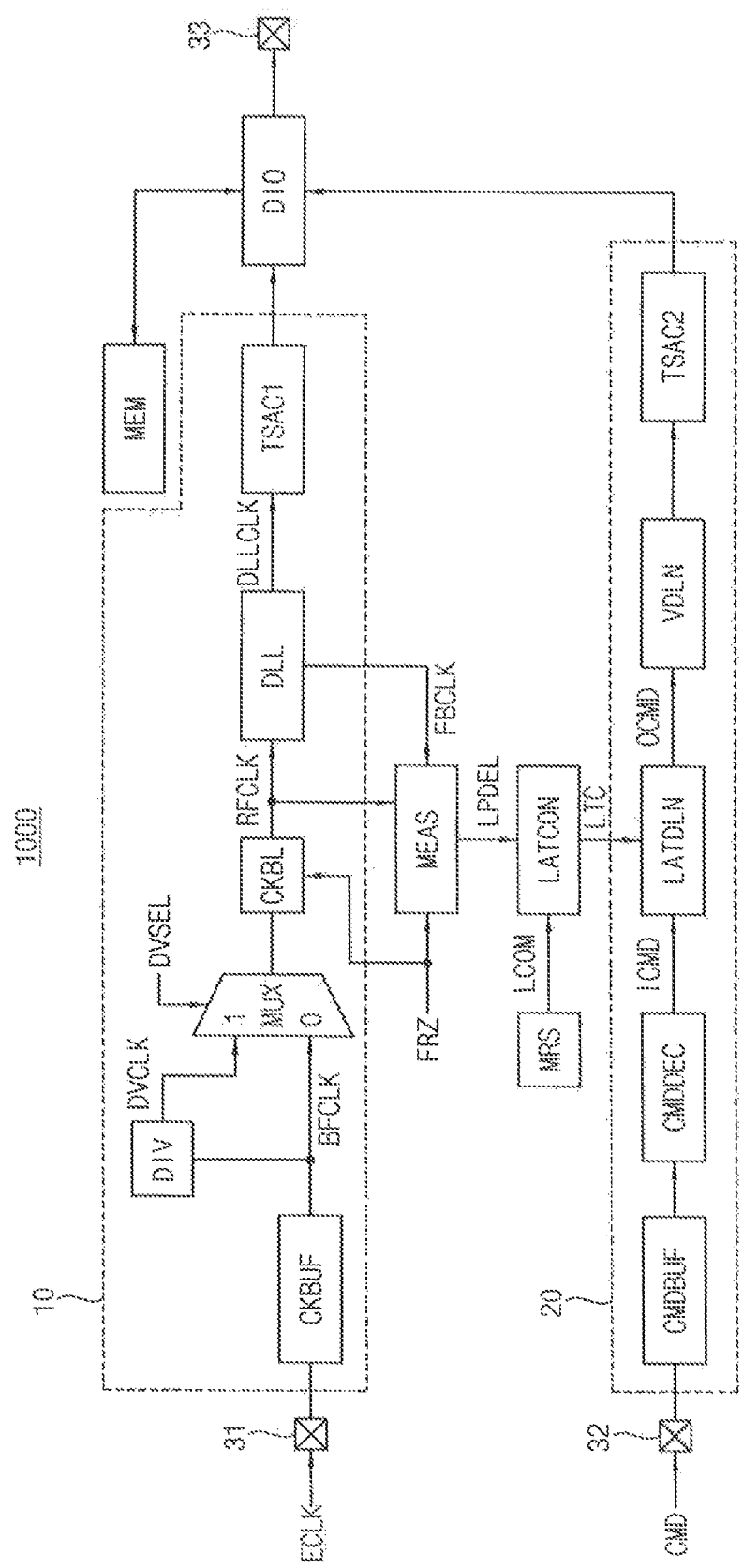
FIG. 2 is a block diagram illustrating a memory device according to example embodiments of the inventive concept.

FIG. 2 is a block diagram illustrating a memory device according to some example embodiments of the inventive concept.

Referring to FIG. 2, a memory device 1000 may include a plurality of input-output pads including a clock pad 31, a control pad 32 and a data pad 33, a clock path circuit 10, a command path circuit 20, a delay measurement circuit MEAS, a latency control circuit LATCON, a mode register set MRS, a memory core MEM and a data input-output circuit DIO.

In addition, the clock pad 31 receives an external clock signal ECLK, the control pad 32 receives a command signal CMD, and the data pad 33 receives and transmits data. Although FIG. 2 illustrates one clock pad 31, one control pad 32 and one data pad 33 for convenience of illustration, it should be understood and appreciated by a person of ordinary skill in the art that the memory device 1000 may include a plurality of clock pads 31, a plurality of control pads 32 and a plurality of data pads 33.

The clock path circuit 10 may include a clock buffer CKBUF, a clock divider DIV, a clock selector MUX, a clock blocker CKBL, a delay-locked loop DLL and a clock transfer path TSAC1.

For example, with regard to the clock path circuit 10, the clock buffer CKBUF buffers the external clock signal ECLK received through the clock pad 31 and outputs a source clock signal BFCLK. A frequency of the source clock signal BFCLK is substantially the same as the external clock signal ECLK. The clock divider DIV divides the source clock signal BFCLK having a first frequency to generate a divided clock signal DVCLK having a second frequency that is less than the first frequency.

The clock selector MUX outputs one of the source clock signal BFCLK and the divided clock signal DVCLK in response to a division selection signal DVSEL. In some example embodiments, the clock selector MUX may select and output the divided clock signal DVCLK as a reference clock signal RFCLK while in an initialization mode, whereas the clock selector MUX may select and output the source clock signal BFCLK as the reference clock signal RFCLK while in a normal operation mode.

The clock blocker CKBL disables an output clock signal of the clock selector MUX during a freezing window time period in response to a clock freezing signal FRZ. A measurement of a loop delay using the clock blocker CKBL will be described below with reference to FIG. 8. The clock blocker CKBL may be omitted in some example embodiments of the inventive concept depending on a scheme of measuring the loop delay.

The delay-locked loop DLL, such as shown in FIG. 2, delays the reference clock signal RFCLK, and generates a feedback clock signal FBCLK and a locked-delayed clock signal DLLCLK. Example embodiments of the delay-locked loop DLL of the inventive concept will be described below with reference to FIGS. 3 and 13. The locked-delayed clock signal DLLCLK is provided to the data input-output circuit DIO (FIG. 2) via the clock transfer path TSAC1.

With continued reference to FIG. 2, the command path circuit 20 may include a command buffer CMDBUF, a command decoder CMDDEC, a latency delay circuit LATDLN, a variable delay circuit VDLN and a command transfer path TSAC2.

The command buffer CMDBUF buffers the command signal CMD received through the control pad 32, and the command decoder CMDDEC decodes the received command to generate an internal command signal ICMD.

The latency delay circuit LATDLN delays the internal command signal ICMD by a compensated latency amount based on a latency control signal LTC from the latency control circuit LATCON to output a compensated command signal OCMD. The compensated latency will be described below with reference to FIG. 18. The output compensated command signal OCMD is provided to the data input-output circuit DIO via the variable delay circuit VDLN and the command transfer path TSCA2. A delay time of the command transfer path TSCA2 may be substantially the same as a delay time of the clock transfer path TSCA1. In addition, a delay time of the variable delay circuit VDLN in the command path circuit 20 may be set to be substantially the same as a delay time of a variable delay circuit (not shown) in the delay-locked loop DLL of the clock path circuit 10.

The delay measurement circuit MEAS may measure the loop delay of the delay-locked loop DLL based on a value of the clock freezing signal FRZ, the reference clock signal RFCLK and the feedback clock signal FBCLK after the locking operation is completed. As described above, the divided clock signal DVCLK may be selected as the reference clock signal RFCLK in the initialization mode and the loop delay may correspond to a delay of the feedback signal FBCLK with respect to the divided clock signal DVCLK. Example embodiments of the delay measurement circuit MEAS will be described below with reference to FIGS. 7 and 15.

The latency control circuit LATCON may generate a latency control signal LTC corresponding to the compensated latency in the normal operation mode. The compensated latency may be calculated by subtracting the loop delay from a command latency. In addition, the latency control circuit LATCON may generate an odd flag signal indicating whether the compensated latency corresponds to odd times a clock cycle period of the source clock signal BFCLK.

The mode register set MRS may be configured to store information or values for operations of the memory device 1000. For example, the mode register set MRS may store a command latency LCOM such as a CAS latency (CL), a CAS write latency (CWL), an on-die terminal (ODT) latency, etc. The stored command latency LCOM may be provided to the latency control circuit LATCON.

The memory core MEM may include a memory cell array in which a plurality of memory cells are disposed and circuits to control accesses to the memory cells. The memory core MEM may include a volatile memory device such as a dynamic random access memory (DRAM), a static random access memory (SRAM), etc. and a non-volatile memory device such as a flash memory, a phase change random access memory (PRAM), a magnetic random access memory (MRAM), a resistive random access memory (RRAM), etc., a vertical NAND. There may also be a memory controller that reads/programs data stored in the memory core.

The data input-output circuit DIO may include drivers to output read data to the data pads 33 in a read operation and reception buffers to buffer write data received through the data pads 33 in a write operation. The data input-output circuit DIO may control input-output timing of data, ODT timing etc. associated with a clock signal ECLK received via the clock pad 31 and provided through the clock path circuit 10, and a command signal provided through the command path circuit 20.

Figure 3:
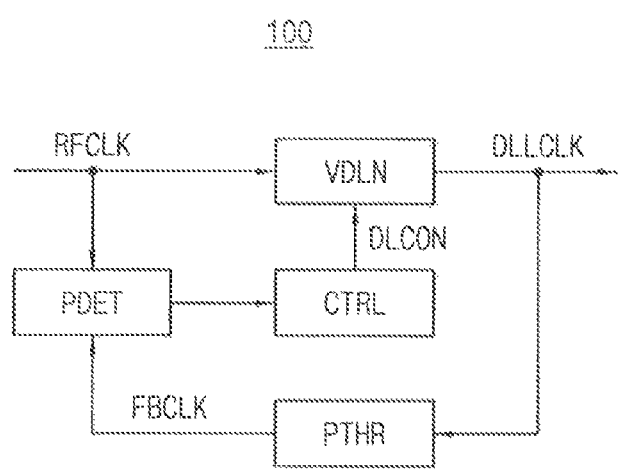
FIG. 3 is a block diagram illustrating a delay-locked loop circuit included in the memory device of FIG. 2 according to example embodiments of the inventive concept.

FIG. 3 is a block diagram illustrating an example embodiment of a delay-locked loop circuit included in the memory device of FIG. 2.

Referring to FIG. 3, a delay-locked loop circuit 100 may include a variable delay circuit VDLN, a phase detector PDET, a replica delay circuit PTHR and a controller CTRL.

The variable delay circuit VDLN delays a reference clock signal RFCLK by a delay time corresponding to a delay control signal DLCON from the controller CTRL to output a locked-delayed clock signal DLLCLK. The replica delay circuit PTHR delays the locked-delayed clock signal DLLCLK by a fixed delay time to output a feedback clock signal FBCLK. The delay time of the replica delay circuit PTHR may be obtained by modeling a delay on a clock path. For example, the delay time of the replica delay circuit PTHR may be modeled as a sum of delay times of the clock buffer CKBUF, the clock transfer path TSAC1 and the data input-output circuit DIO in FIG. 2.

The phase detector PDET compares phases of the reference clock signal RFCLK and the feedback clock signal FBCLK to provide a comparison result signal to the controller CTRL. The controller CTRL may change a value of the delay control signal DLCON based on the comparison result signal so that the reference clock signal RFCLK and the feedback clock signal FBCLK may be aligned in the same phases.

As such, the delay-locked loop circuit 100 may perform the locking operation to align the reference clock signal RFCLK and the feedback clock signal FBCLK in the same phases and the delay-locked loop circuit 100 may store the value of the delay control signal DLCON as locking information after the locking operation is completed.

According to example embodiments of the inventive concept, the divided clock signal DVCLK may be provided as the reference clock signal RFCLK. For example, the divided clock signal DVCLK may be an input RFCLK to the delay-locked loop circuit 100 in the initialization mode, and the source clock signal BFCLK may be provided as the reference clock signal RFCLK in the normal operation mode.

In the initialization mode, the delay-locked loop circuit 100 may the locking operation to align the divided clock signal DVCLK and the feedback clock signal FBCLK that is delayed from the divided clock signal DVCLK. In the normal operation mode, the delay-locked loop circuit 100 may delay the source clock signal BFCLK based on the locking information obtained during the initialization mode to generate the locked-delayed clock signal DLLCLK for access operations of the memory device 1000.

Figures 4A, 4B:
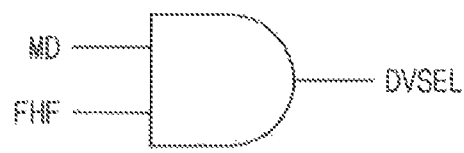
FIGS. 4A and 4B are diagrams describing selection of clock signals according to example embodiments of the inventive concept.

FIGS. 4A and 4B are diagrams for describing selection of clock signals according to example embodiments of the inventive concept.

The above-described division selection signal DVSEL may be generated based on a mode signal MD and a high frequency flag signal FHF. A logic level of the mode signal MD may indicate the initialization mode or the normal operation mode and a logic level of the high frequency flag signal FHF may indicate whether a frequency of the external clock signal ECLK provided from the memory controller is higher than a predetermined threshold frequency.

In some example embodiments of the inventive concept, as illustrated in FIGS. 4A and 4B, the division selection signal DVSEL may be generated by performing an AND operation on the mode signal MD and the high frequency flag signal FHF. The mode signal MD may have a logic high level H to indicate the initialization mode and a logic low level L to indicate the normal operation mode. The high frequency flag signal FHF may be activated in the logic high level H when the frequency of the external clock signal ECLK is higher than the threshold frequency.

The clock selector MUX in FIG. 2 may select one of the source clock signal BFCLK and the divided clock signal DVCLK in response to the division selection signal DVSEL and output the selected one as the reference clock signal RFCLK. In the example embodiment of FIGS. 4A and 4B, the divided clock signal DVCLK is selected and provided as the input to the delay-locked loop DLL only when the frequency of the external clock signal ECLK is higher than the threshold frequency, and otherwise the source clock signal BFCLK is selected and provided as the input to the delay-locked loop DLL.

FIGS. 4A and 4B illustrate an example of the logic levels of the signals MD and FHF and an example of the AND operation for generating the division selection signal DVSEL, but the logic levels and the logic operation are not limited thereto. In some example embodiments of the inventive concept, the divided clock signal DVCLK may be selected as the reference clock signal RFCLK in the initialization mode regardless of the frequency of the external clock signal ECLK. In other example embodiments, the divided clock signal DVCLK may be selected as the reference clock signal RFCLK if the frequency of the external clock signal ECLK is higher than the threshold frequency in the normal operation mode as well as the initialization mode.

Figure 5:
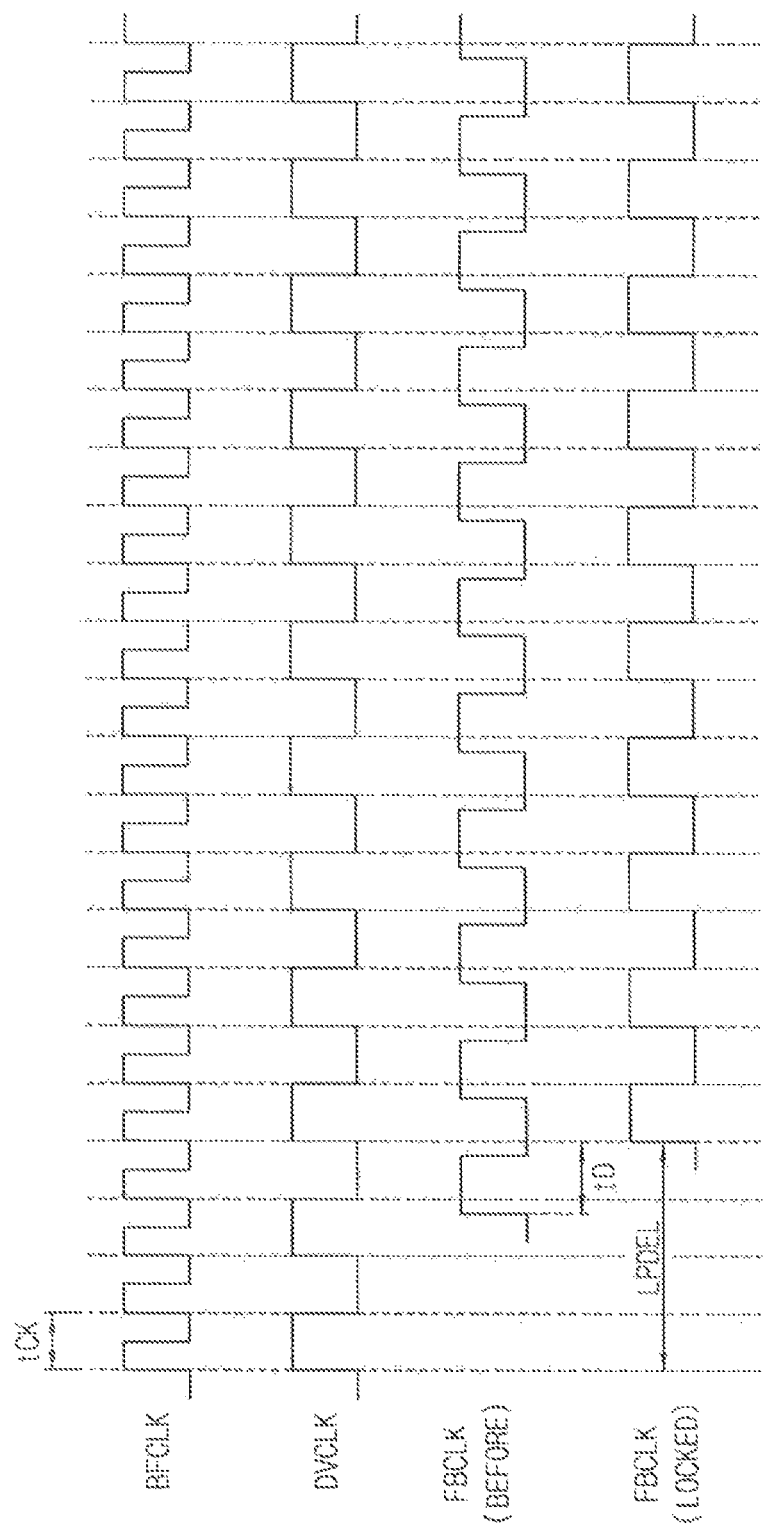
FIG. 5 is a timing diagram illustrating a locking operation in an initialization mode by a memory device including the delay-locked loop circuit of FIG. 3.

FIG. 5 is a timing diagram illustrating a locking operation in an initialization mode by a memory device including the delay-locked loop circuit of FIG. 3.

FIG. 5 shows phases of a source clock signal BFCLK having a clock cycle period tCK, a divided clock signal DVCLK and a feedback clock signal FBCLK before and after the locking operation (BEFORE, LOCKED). In FIG. 5, a first frequency of the source clock signal BFCLK is two times a second frequency of the divided clock signal DVCLK. FIG. 5 illustrates a non-limiting example of a division ratio of two for convenience of illustration, and the first frequency may be L (L is an arbitrary natural number) times the second frequency.

Referring to FIG. 5, the locking operation in the initialization mode may be performed by aligning the divided clock signal DVCLK and the feedback clock signal FBCLK in same phases. The controller CTRL of the delay-locked loop circuit 100 in FIG. 3 may store the value of the delay control signal DLCON corresponding to a delay time tD in FIG. 5 as the locking information. The delay measurement circuit MEAS in FIG. 2 may measure the loop delay LPDEL after the locking operation is completed and provide the measured loop delay LPDEL to the latency control circuit LATCON. The loop delay LPDEL may correspond to an even number multiple of the clock cycle period tCK of the source clock signal BFCLK when the divided clock signal DVCLK and the feedback clock signal FBCLK are aligned in the same phases.

Figure 6:
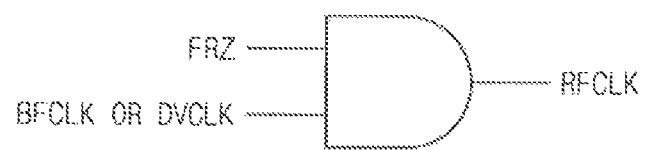
FIG. 6 is a diagram illustrating a clock blocker included in the memory device of FIG. 2 according to example embodiments of the inventive concept.

FIG. 6 is a diagram illustrating an example embodiment of a clock blocker included in the memory device of FIG. 2.

Referring to FIG. 6, a clock blocker CKBL may perform an AND operation on the a clock freezing signal FRZ and the output of the clock selector MUX in FIG. 2 to generate the reference clock signal RFCLK. As described above, the output of the clock selector MUX may be source clock signal BFCLK or the divided clock signal DVCLK depending on the division selection signal DVSEL. As will be described below with reference to FIG. 8, the clock freezing signal FRZ may be deactivated, for example, in the logic low level, during a freezing window time period FWIN to block and disable the source clock signal BFCLK or the divided clock signal DVCLK during the freezing window time period FWIN. FIG. 6 illustrates a non-limiting example embodiment that the clock blocker CKBL is implemented with an AND gate, but the clock blocker CKBL may be implemented variously using a transistor, a transmission gate, etc.

Figure 7:
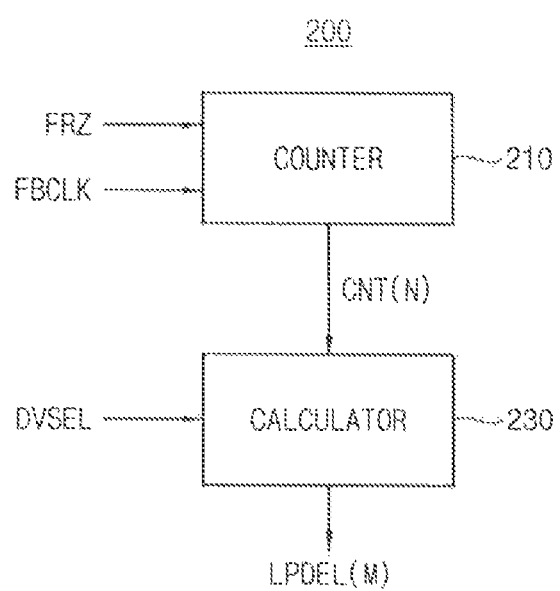
FIG. 7 is a block diagram illustrating of a delay measurement circuit included in the memory device of FIG. 2 according to example embodiments of the inventive concept.
Figure 8:
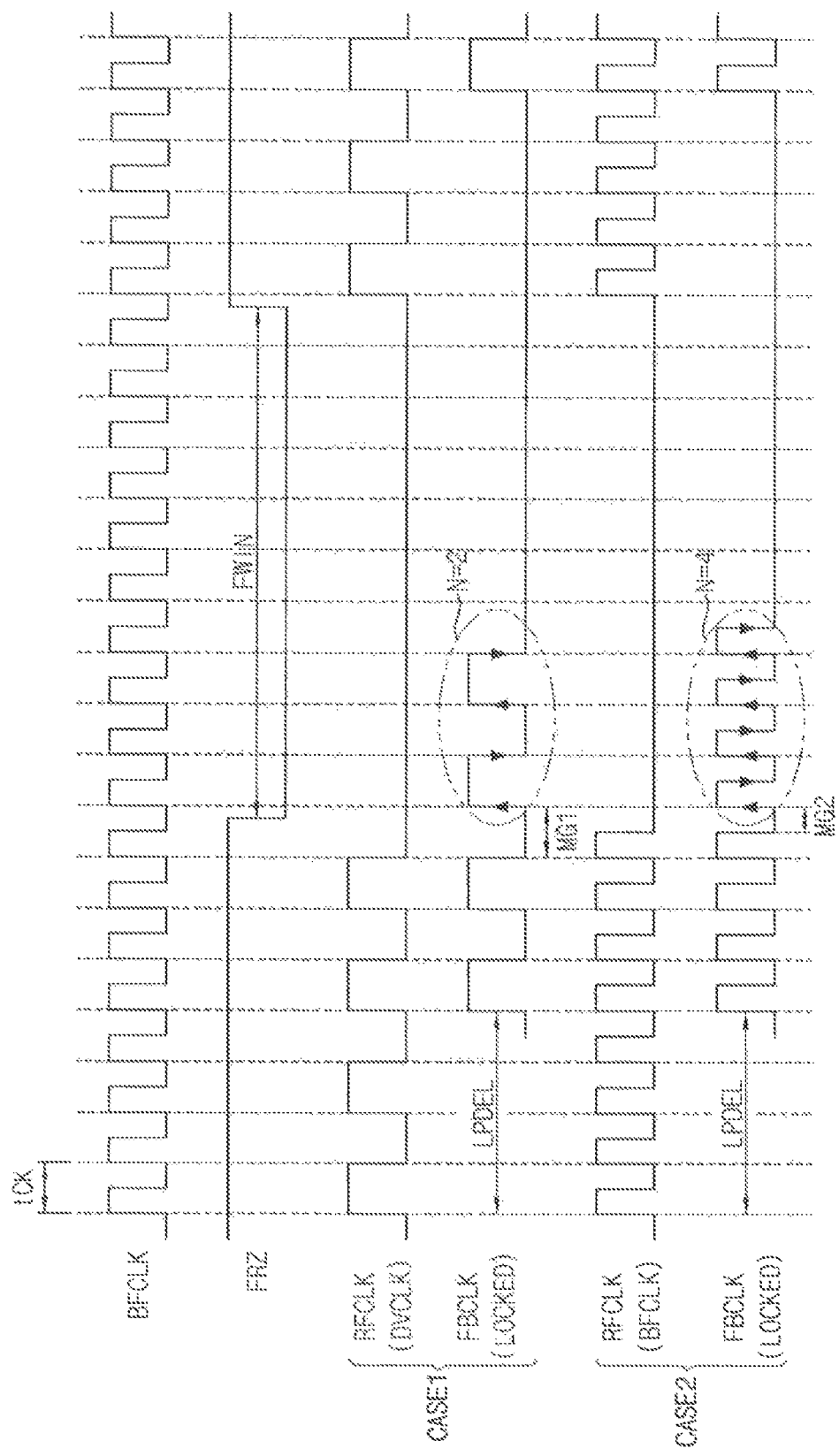
FIG. 8 is a timing diagram illustrating the measuring of a loop delay in an initialization mode by a memory device including the delay measurement circuit of FIG. 7 according to example embodiments of the inventive concept.
Figure 9:
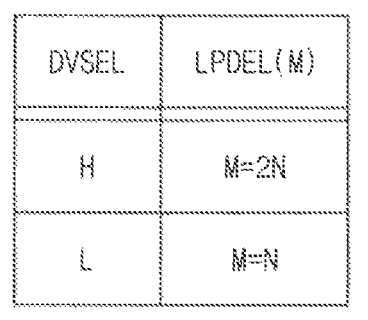

FIG. 7 is a block diagram illustrating an example embodiment of a delay measurement circuit included in the memory device of FIG. 2, FIG. 8 is a timing diagram illustrating an example embodiment of measuring a loop delay in an initialization mode by a memory device including the delay measurement circuit of FIG. 7, and FIG. 9 is a diagram for describing an operation of a calculator included in the delay measurement circuit of FIG. 7.

Referring to FIG. 7, a delay measurement circuit 200 may include a counter 210 and a calculator 230.

As illustrated in FIG. 8, the counter 210 may count a clock cycle number of the feedback clock signal FBCLK during the freezing window time period FWIN while the reference clock signal RFCLK is disabled based on the clock freezing signal FRZ, to generate a count signal CNT. The clock freezing signal FRZ may be deactivated in the logic low level for a proper time interval corresponding to the freezing window time period FWIN after the locking operation is completed. The count signal CNT may be a plurality of bit signals indicating the measured clock cycle number N as will be described below with reference to FIGS. 10 and 12.

In FIG. 8, a first case CASE1 corresponds to a case that the divided clock signal DVCLK is selected as the reference clock signal RFCLK and provided as the input to the delay-locked loop DLL and a second case CASE2 corresponds to a case that the source clock signal BFCLK is selected as the reference clock signal RFCLK and provided as the input to the delay-locked loop DLL. The counter 210 may count rising edges or falling edges of the feedback clock signal FBCLK during the freezing window time period FWIN and provide the counted number as the clock cycle number N, as will be described below with reference to FIGS. 10 and 12. In the example of FIG. 8, the clock cycle number N corresponds to 2 for the first case CASE1 and 4 for the second case CASE2. With regard to FIG. 8, it is explained in part herein below that as the operation margins to perform an operation are smaller, the probability of an error occurring increases.

For example, in the first case CASE1, an operation margin MG1 for measuring the loop delay LPDEL corresponds to the whole clock cycle period tCK of the source clock signal BFCLK. However, in the second case CASE2, an operation margin MG2 for measuring the loop delay LPDEL corresponds to a half of the clock cycle period tCK of the source clock signal BFCLK. This reduction of half a clock cycle period of the operation margin in the second case may be the cause of errors. If the frequency of the source clock signal BFCLK is relatively low, the loop delay LPDEL may be measured using the source clock signal BFCLK without particular problems. However, as the frequency of the source clock signal BFCLK increases, the operation margin MG2 decreases and a probability of—a measurement error increases. To facilitate the measurement of the loop delay LPDEL and prevent occurrence of a measurement error, the divided clock signal DVCLK may be used instead of the source clock signal BFCLK in the initialization mode to secure the increased operation margin MG1.

Moreover, in the case where the divided clock signal DVCLK is a frequency that is less than the source clock signal, the operation margin MG1 may be increased. In addition, an operation margin for measuring the loop delay of the delay-locked loop circuit increases when a frequency of the divided clock signal decreases. Thus, according to an embodiment of the inventive concept, operation margins can be set that may decrease the occurrence of error, and/or prevent the errors from increasing when the frequency of a source clock signal increases.

Accordingly, the memory device and the method of operating the memory device in some of the example embodiments of the inventive concept may perform the latency control efficiently by measuring the loop delay using the divided clock signal in the initialization mode.

The calculator 230 may calculate a value of M corresponding to the loop delay LPDEL based on the counted number N of clock cycles. As illustrated in FIG. 9, 2N may be determined as the value M of the loop delay LPDEL when the division selection signal DVSEL has the logic high level H, or the divided clock signal DVCLK is selected as the reference clock signal RFCLK. In contrast, N may be determined as the value M of the loop delay LPDEL when the division selection signal DVSEL has the logic low level L or the source clock signal BFCLK is selected as the reference clock signal RFCLK.

Figure 10:
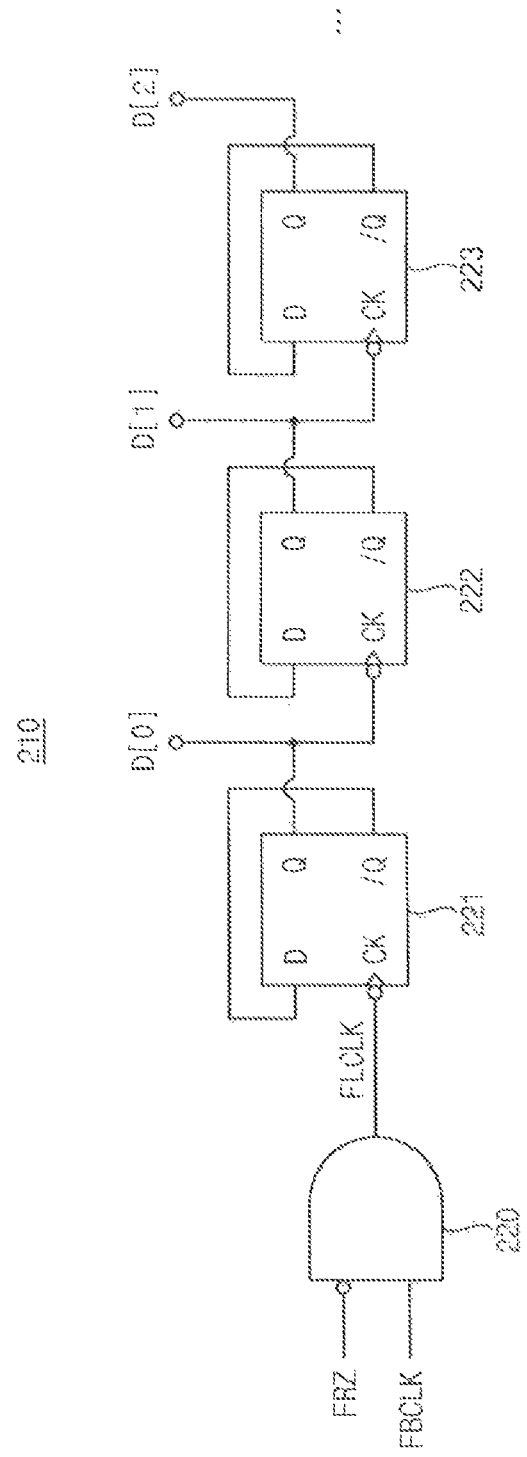
FIG. 10 is a diagram illustrating a counter included in the delay measurement circuit of FIG. 7 according to example embodiments of the inventive concept.

FIG. 10 is a diagram illustrating an example embodiment of a counter included in the delay measurement circuit of FIG. 7.

Referring to FIG. 10, a counter 210 may include a clock input circuit 220 and a ripple counter.

The clock input circuit 220 may generate a filtered clock signal FLCLK based on a clock freezing signal FRZ and a feedback clock signal FBCLK. As will be described below with reference to FIG. 12, the filtered clock signal FLCLK may be generated by passing the feedback clock signal FBCLK only during the freezing window time period FWIN.

The ripple counter may include a plurality of flip-flops 221, 222 and 223 that are cascade-coupled to generate bit signals D[0], D[1] and D[2] corresponding to the clock cycle number N of the feedback clock signal FBCLK during the freezing window time period FWIN. FIG. 10 illustrates a non-limiting example of the three flip-flops for convenience of illustration, and the number of the flip-flops in the ripple counter may be determined variously.

In some example embodiments of the inventive concept, the flip-flops 221, 222 and 223 may be implemented with negative-edge triggered flip-flops to generate the bit signals D[0], D[1] and D[2] toggling sequentially. In other example embodiments of the inventive concept, the flip-flops 221, 222 and 223 may be implemented with positive-edge triggered flip-flops to generate the bit signals D[0], D[1] and D[2] toggling sequentially.

Figure 11A:
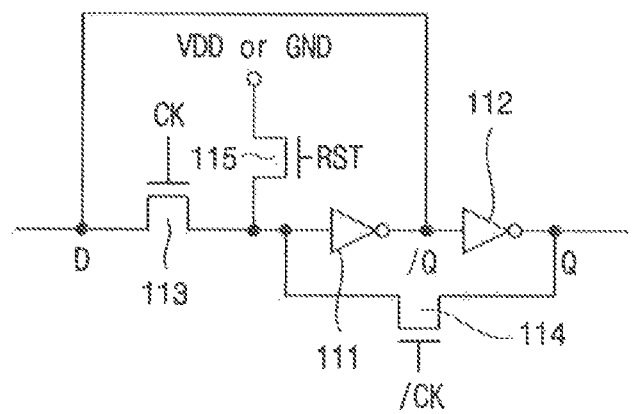
FIGS. 11A and 11B are circuit diagrams illustrating flip-flops included in the counter of FIG. 10 according to example embodiments of the inventive concept.
Figure 11B:
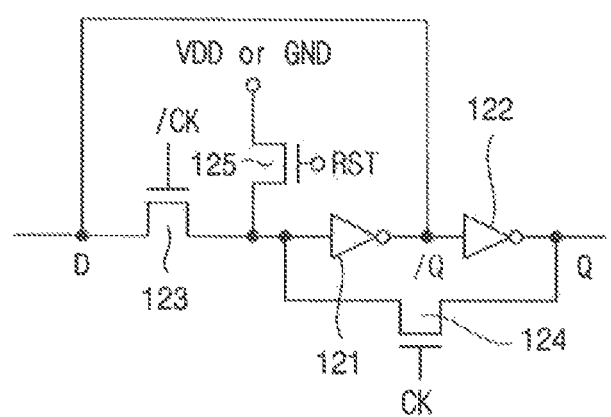

FIGS. 11A and 11B are circuit diagrams illustrating example embodiments of flip-flops included in the counter of FIG. 10. A person of ordinary skill in the art should understand and appreciate that the embodiments of the inventive concept are not limited to the configurations shown in FIG. 11A and FIG. 11B.

FIG. 11A illustrates an example of a positive-edge triggered flip-flop and FIG. 11B illustrates an example of a negative-edge triggered flip-flop. The non-limiting example configuration of the flip-flops in FIGS. 11A and 11B are presented for describing the toggling operation of the ripple counter in FIG. 10, and the configuration of the flip-flops may be variously changed.

Referring to FIG. 11A, the positive-edge triggered flip-flop may include a first inverter 111, a second inverter 112, a first switch 113 and a second switch 114.

The output of the first inverter 111 is coupled to the input of the second inverter 112, and the output of the second inverter 112 is coupled to the input of the first inverter 111 via the second switch 114, thereby forming a latch configuration. In the example of FIG. 11A, the output of the first inverter 111 corresponds to an inversion output terminal /Q and the output of the second inverter 112 corresponds to a non-inversion output terminal Q. The first switch 113 is coupled between a data terminal D and the input of the first inverter 111 and the control terminal CK of the first switch 113 corresponds to a clock terminal. A clock signal CLK is applied to the control terminal CK of the first switch 113 and an inversion signal /CLK of the clock signal CLK is applied to the control terminal /CK of the second switch 114.

The positive-edge triggered flip-flop of FIG. 11A may further include a reset switch 115 for initializing a state of the flip-flop. When the reset switch 115 is turned on in response to a reset signal RST, the inversion output terminal /Q and the output terminal Q may be initialized respectively to logic low or logic high depending on the reset voltage VDD or GND.

When the clock signal CLK applied to the control terminal CK is logic low, the flip-flop of FIG. 11A is in a storage state that does not change even though the logic level of the data terminal D is changed. When the clock signal CLK transitions from logic low to logic high, that is, at the rising edge of the clock signal CLK, the logic level of the data terminal D is transferred into the non-inversion output terminal Q. The flip-flop such that the logic state is determined in synchronization with the edge of the signal applied to the clock terminal CK is referred to as an edge triggered flip-flop, and the flip-flop of FIG. 11A corresponds to a positive-edge triggered flip-flop.

The positive-edge triggered flip-flop may perform toggling when the inversion output terminal /Q is coupled to the data terminal D. When the clock signal CLK applied to the control terminal CK transitions to logic low, the second switch 114 is turned on and the data terminal D is set to logic level opposite to the non-inversion output terminal Q but the state of the flip-flop is not changed since the first switch 113 is turned off. When the clock signal CLK transitions to logic high, the first switch 113 is turned on and logic level of the inversion output terminal is applied to the input of the first inverter 111, thereby inverting the logic state of the non-inverting output terminal Q. As such, the positive-edge triggered flip-flop performs toggling by inverting the storage state from logic high to logic low or from logic low to logic high at each rising edge of the clock signal CLK applied to the control terminal CK.

Referring to FIG. 11B, the negative-edge triggered flip-flop has a configuration similar to the positive-edge triggered flip-flop of FIG. 11A, but the inversion signal /CLK of the clock signal CLK is applied to the control gate /CK of the first switch 123 and the clock signal CLK is applied to the control gate CK of the second switch 124. For example, the flip-flops of FIGS. 11A and 11B are different in that the control terminals CK and /CK are exchanged.

The negative-edge triggered flip-flop of FIG. 11B performs toggling in response to the falling edges of the clock signal CLK whereas the positive-edge triggered flip-flop of FIG. 11A performs toggling in response to the rising edges of the clock signal CLK. When the clock signal CLK applied to the control terminal CK transitions to logic high, the second switch 124 is turned on and the data terminal D is set to logic level opposite to the non-inversion output terminal Q but the state of the flip-flop is not changed since the first switch 123 is turned off. When the clock signal CLK transitions to logic low, the first switch 123 is turned on and logic level of the inversion output terminal is applied to the input of the first inverter 111, thereby inverting the logic state of the non-inverting output terminal Q. As such, the negative-edge triggered flip-flop performs toggling by inverting the storage state from logic high to logic low or from logic low to logic high at each falling edge of the clock signal CLK applied to the control terminal CK.

The counter 210 may include such positive-edge triggered flip-flops and/or negative-edge triggered flip-flops to count the clock cycle number N. An example embodiment of counting the clock cycle number N using the negative-edge triggered flip-flops of FIG. 11A are described with response to FIG. 12, but example embodiments are not limited thereto. The counter 210 may implemented using the positive-edge triggered flip-flops as described with reference to FIG. 11B.

FIG. 12 is a timing diagram illustrating an example operation of the counter of FIG. 10.

Referring to FIGS. 10 and 12, the clock input circuit 220 may generate the filtered clock signal FLCLK by passing the feedback clock signal FBCLK only during the freezing window time period FWIN of the clock freezing signal FRZ. The plurality of flip-flops 221, 222 and 223 may be implemented with, for example, with negative-edge triggered flip-flops to generate the bit signals D[0], D[1] and D[2] that are toggling sequentially in response to the falling edges of the output of the previous stage. In the example of FIG. 12, the resulting binary code D[2:0] may be "011" and thus the measured clock cycle number N may be "3" corresponding to the number of the falling edges of the feedback clock signal FBCLK within the freezing window time period FWIN.

The calculator 230 may provide the value of M representing the loop delay LPDEL by multiplying a division ratio and the clock cycle number N. For example, when the division ratio is two, for example, when the first frequency of the source clock signal BFCLK is two times the second frequency of the divided clock signal DVCLK, the calculator gives the calculated M=2*3=6 for the example of FIG. 12.

As such, the memory device and the method of operating the memory device according to example embodiments of the inventive concept may perform the latency control efficiently by measuring the loop delay using the divided clock signal in the initialization mode.

Figure 13:
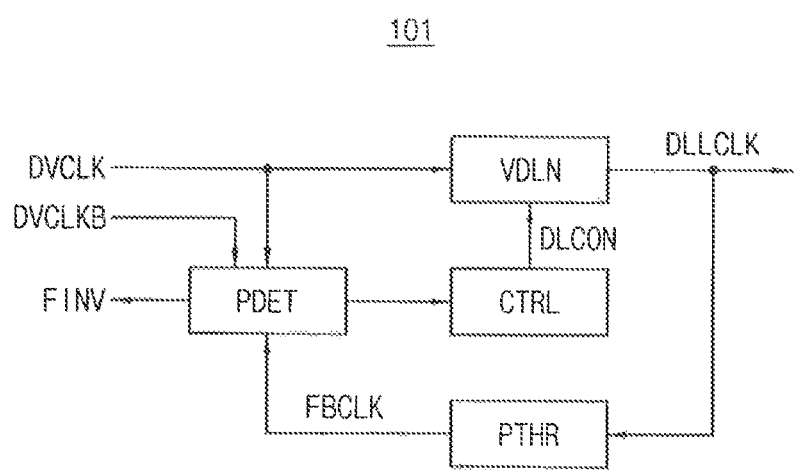
FIG. 13 is a block diagram illustrating a delay-locked loop circuit included in the memory device of FIG. 2 according to example embodiments of the inventive concept.

FIG. 13 is a block diagram illustrating an example embodiment of a delay-locked loop circuit included in the memory device of FIG. 2.

Referring to FIG. 13, a delay-locked loop circuit 101 may include a variable delay circuit VDLN, a phase detector PDET, a replica delay circuit PTHR and a controller CTRL.

The variable delay circuit VDLN delays a reference clock signal RFCLK by a delay time corresponding to a delay control signal DLCON from the controller CTRL to output a locked-delayed clock signal DLLCLK. The replica delay circuit PTHR delays the locked-delayed clock signal DLLCLK by a fixed delay time to output a feedback clock signal FBCLK. The delay time of the replica delay circuit PTHR may be obtained by modeling a delay on a clock path. For example, the delay time of the replica delay circuit PTHR may be modeled as a sum of delay times of the clock buffer CKBUF, the clock transfer path TSAC1 and the data input-output circuit DIO in FIG. 2.

The phase detector PDET compares phases of the reference clock signal RFCLK and the feedback clock signal FBCLK to provide a comparison result signal to the controller CTRL. The controller CTRL may change a value of the delay control signal DLCON based on the comparison result signal so that the divided clock signal DVCLK and the feedback clock signal FBCLK may be aligned in the same phases or the opposite phases.

In comparison with the delay-locked loop circuit 100 of FIG. 3, the delay-locked loop circuit 101 of FIG. 13 may align the divided clock signal DVCLK and the feedback clock signal FBCLK in the same phases or in opposite phases.

For example, the divided clock signal DVCLK and the feedback clock signal FBCLK may be aligned in opposite phases by providing an inverted-divided clock signal DVCLKB that is an inverted signal of the divided clock signal DVCLK and aligning the inverted-divided clock signal DVCLKB and the feedback clock signal FBCLK in same phases. The phase detector PDET may generate an inversion signal FINV indicating whether the divided clock signal DVCLK and the feedback clock signal FBCLK are aligned in the same phases or in opposite phases.

As such, the delay-locked loop circuit 101 may perform the locking operation to align the reference clock signal RFCLK and the feedback clock signal FBCLK in the same phases or in the opposite phases and the delay-locked loop circuit 101 may store the value of the delay control signal DLCON as locking information after the locking operation is completed. In the normal operation mode, the delay-locked loop circuit 101 may delay the source clock signal BFCLK based on the locking information obtained during the initialization mode to generate the locked-delayed clock signal DLLCLK for access operations of the memory device 1000.

Figure 14:
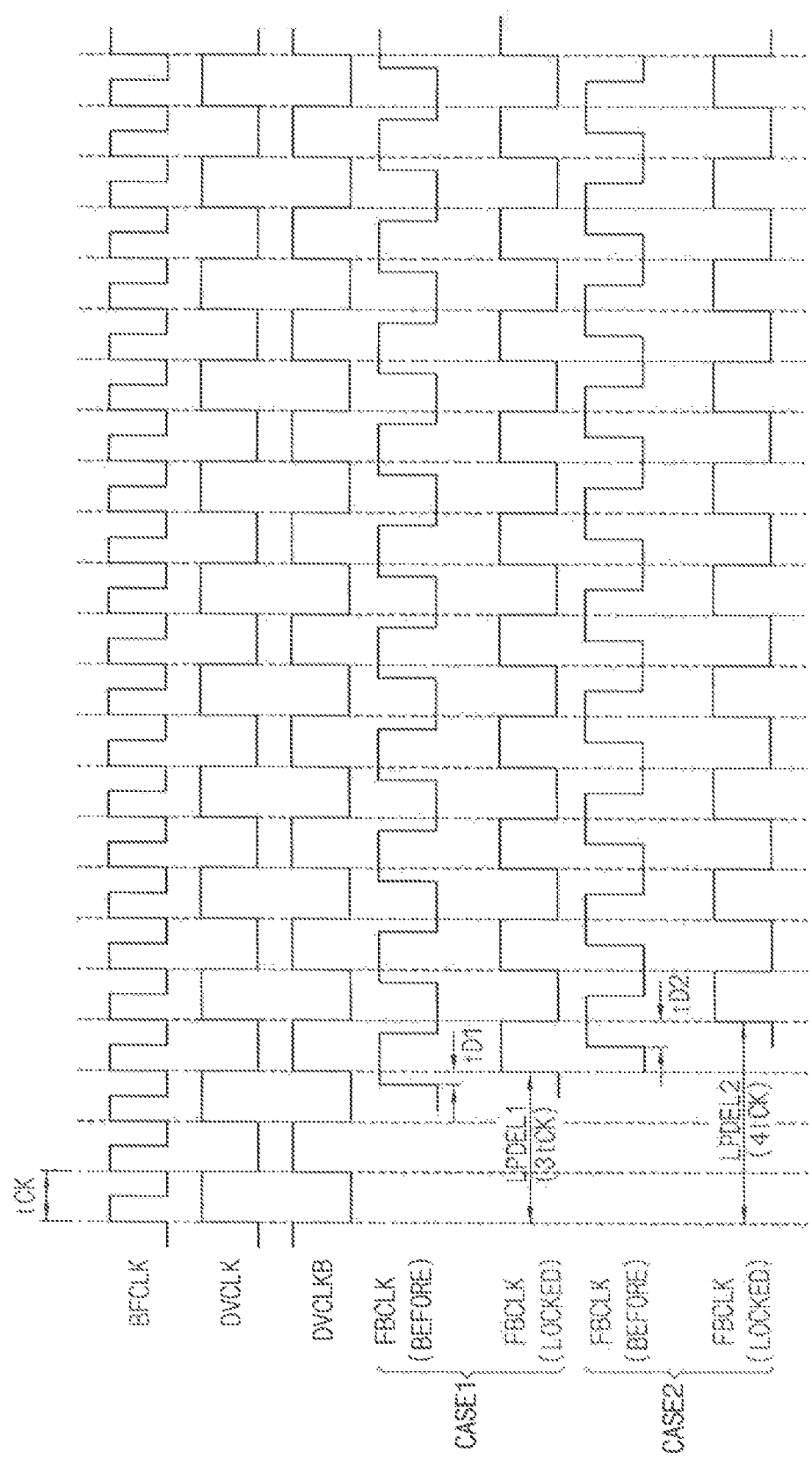
FIG. 14 is a timing diagram illustrating a locking operation in an initialization mode by a memory device including the delay-locked loop circuit of FIG. 13.

FIG. 14 is a timing diagram illustrating a locking operation in an initialization mode by a memory device including the delay-locked loop circuit of FIG. 13.

FIG. 14 shows phases of a source clock signal BFCLK having a clock cycle period tCK, a divided clock signal DVCLK, an inverted-divided clock signal DVCLKB and a feedback clock signal FBCLK before and after the locking operation (BEFORE, LOCKED).

In FIG. 14, a first case CASE1 corresponds to a case that the divided clock signal DVCLK and the feedback clock signal FBCLK are aligned in the opposite phases and a second case CASE2 corresponds to a case that the divided clock signal DVCLK and the feedback clock signal FBCLK are aligned in the same phases. The loop delay LPDEL is an odd number multiple (e.g., three) of the clock cycle period tCK of the source clock signal BFCLK in the first case CASE1 and the loop delay LPDEL is a multiple that is an even number (e.g., four) of the clock cycle period tCK of the source clock signal BFCLK in the first case CASE2.

In FIG. 14, a first frequency of the source clock signal BFCLK is two times a second frequency of the divided clock signal DVCLK. FIG. 14 illustrates a non-limiting example of a division of two for convenience of illustration, and the first frequency may be an arbitrary natural number times the second frequency. The controller CTRL of the delay-locked loop circuit 101 in FIG. 13 may store the value of the delay control signal DLCON corresponding to a delay time tD1 or tD2 in FIG. 14 as the locking information. The delay measurement circuit MEAS in FIG. 2 may measure the loop delay LPDEL after the locking operation is completed and provide the measured loop delay LPDEL to the latency control circuit LATCON.

As such, the loop delay LPDEL may correspond to an even number multiple of the clock cycle period tCK of the source clock signal BFCLK when the divided clock signal DVCLK and the feedback clock signal FBCLK are aligned in the same phases, and the loop delay LPDEL may correspond to an odd number multiple of the clock cycle period tCK of the source clock signal BFCLK when the divided clock signal DVCLK and the feedback clock signal FBCLK are aligned in the opposite phases.

Figure 15:
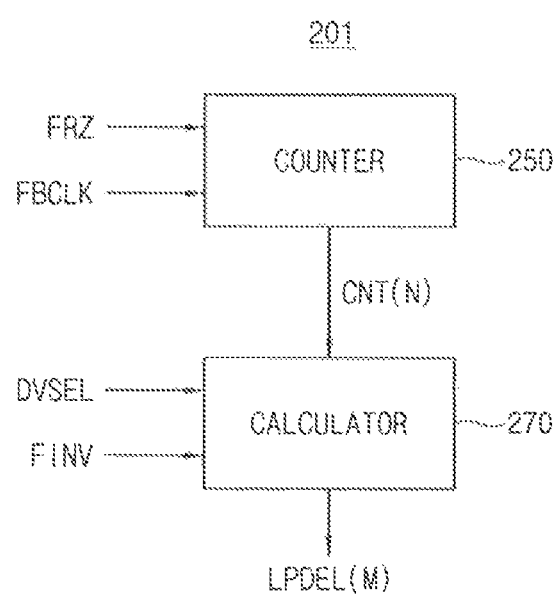
FIG. 15 is a block diagram illustrating a delay measurement circuit included in the memory device of FIG. 2 according to example embodiments of the inventive concept.
Figure 16:
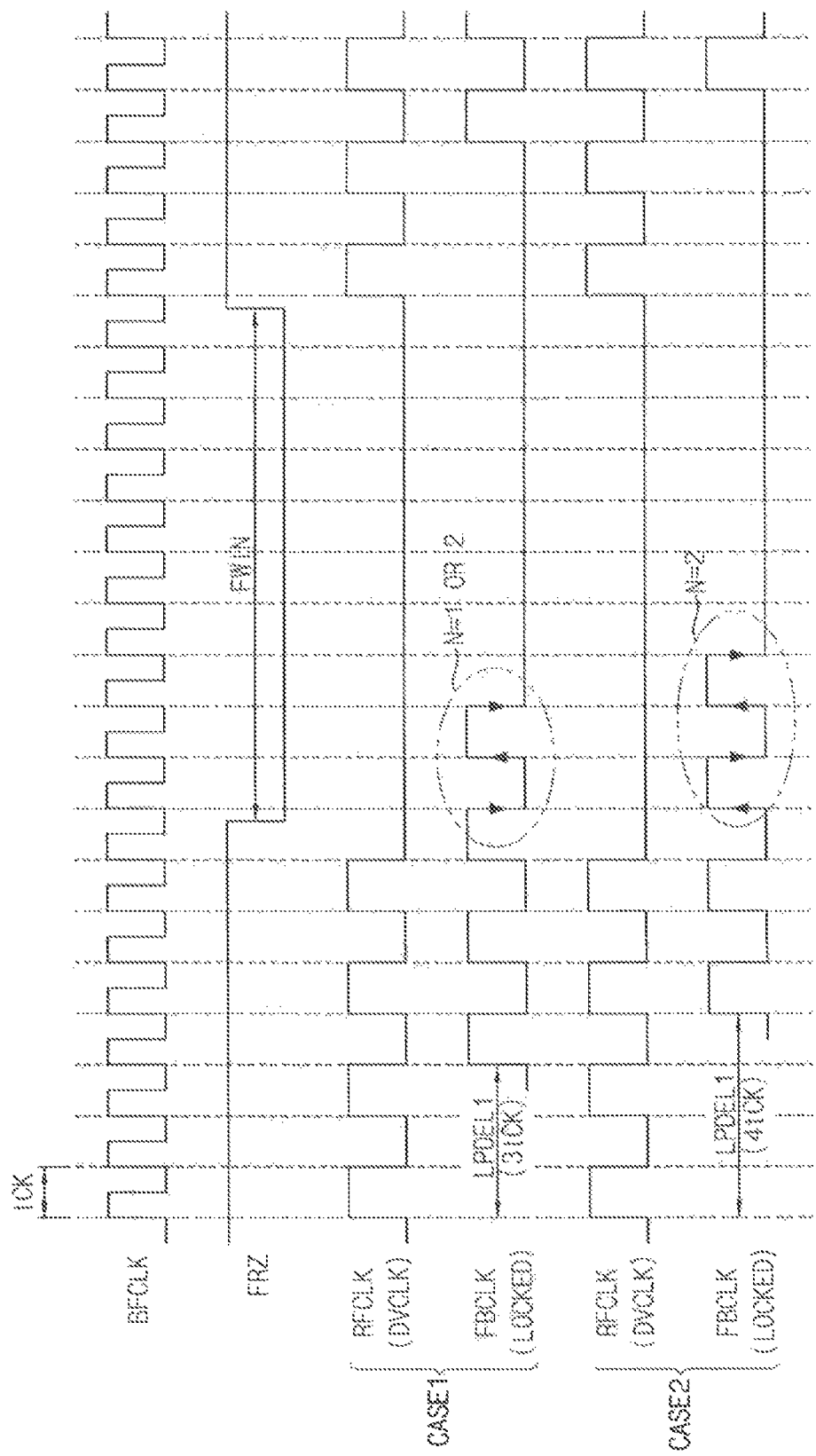
FIG. 16 is a timing diagram illustrating measuring of a loop delay in an initialization mode by a memory device including the delay measurement circuit of FIG. 15 according to example embodiments of the inventive concept.
Figures 17, 18:
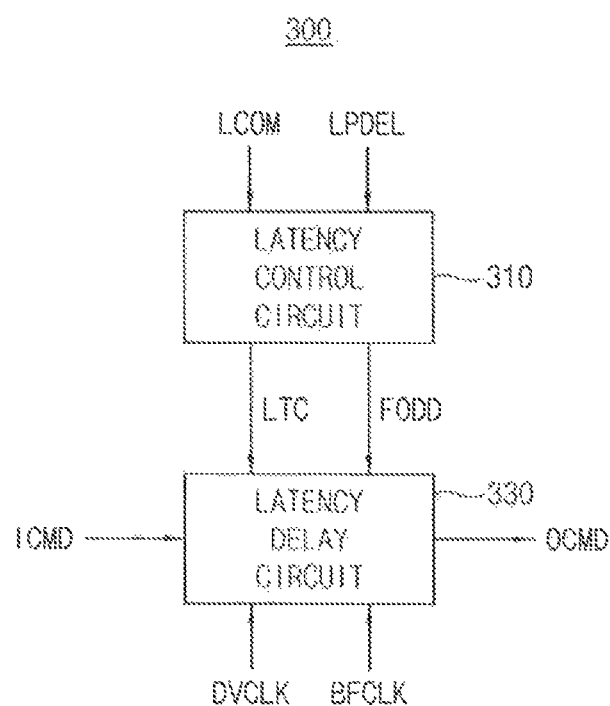
FIG. 17 is a diagram for describing an operation of a calculator included in the delay measurement circuit of FIG. 15.
FIG. 18 is a block diagram illustrating a latency control circuit and a latency delay circuit included in the memory device of FIG. 2 according to example embodiments of the inventive concept.

FIG. 15 is a block diagram illustrating an example embodiment of a delay measurement circuit included in the memory device of FIG. 2, FIG. 16 is a timing diagram illustrating an example embodiment of measuring a loop delay in an initialization mode by a memory device including the delay measurement circuit of FIG. 15, and FIG. 17 is a diagram for describing an operation of a calculator included in the delay measurement circuit of FIG. 15.

Referring to FIG. 15, a delay measurement circuit 201 may include, for example a counter 250 and a calculator 270.

As illustrated in FIG. 16, the counter 250 may count a clock cycle number of the feedback clock signal FBCLK during the freezing window time period FWIN while the reference clock signal RFCLK is disabled based on the clock freezing signal FRZ, to generate a count signal CNT. The clock freezing signal FRZ may be deactivated in the logic low level for a proper time interval corresponding to the freezing window time period FWIN after the locking operation is completed. The count signal CNT may be a plurality of bit signals indicating the measured clock cycle number N as described with reference to FIGS. 10 and 12.

In FIG. 16, a first case CASE1 corresponds to a case that the divided clock signal DVCLK and the feedback clock signal FBCLK are aligned in the opposite phases and a second case CASE2 corresponds to a case that the divided clock signal DVCLK and the feedback clock signal FBCLK are aligned in the same phases.

The loop delay LPDEL is may be an odd number (e.g., three) multiple of the clock cycle period tCK of the source clock signal BFCLK in the first case CASE1 and the loop delay LPDEL may be an even number (e.g., four) multiple of the clock cycle period tCK of the source clock signal BFCLK in the first case CASE2. The counter 250 may count rising edges or falling edges of the feedback clock signal FBCLK during the freezing window time period FWIN and provide the counted number as the clock cycle number N, as described with reference to FIGS. 10 and 12. In the example of FIG. 16, the clock cycle number N corresponds to 1 or 2 for the first case CASE1 and 2 for the second case CASE2.

The calculator 270 may calculate a value of M corresponding to the loop delay LPDEL based on the counted clock cycle number N. As illustrated in FIG. 17, 2N−1 or 2N+1 may be determined as the value M of the loop delay LPDEL when the division selection signal DVSEL has the logic high level H and the inversion flag signal FINV has the logic high level H, that is, when the divided clock signal DVCLK is selected as the reference clock signal RFCLK and the divided clock signal DVCLK and the feedback clock signal FBCLK are aligned in the opposite phases. 2N may be determined as the value M of the loop delay LPDEL when the division selection signal DVSEL has the logic high level H and the inversion flag signal FINV has the logic low level L, that is, when the divided clock signal DVCLK is selected as the reference clock signal RFCLK and the divided clock signal DVCLK and the feedback clock signal FBCLK are aligned in the same phases. In contrast, N may be determined as the value M of the loop delay LPDEL regardless of the inversion flag signal FINV (DC, don't care) when the division selection signal DVSEL has the logic low level L, that is, the source clock signal BFCLK is selected as the reference clock signal RFCLK.

FIG. 18 is a block diagram illustrating an example embodiment of a latency control circuit and a latency delay circuit included in the memory device of FIG. 2.

Referring to FIG. 18, a circuit 300 including a latency control circuit 310 and a latency delay circuit 330 may adjust a delay on a command path based on a command latency LCOM, a source clock signal BFCLK, a divided clock signal DVCLK and a loop delay LPDEL in a normal operation mode that occurs after an initialization mode. The circuit 300 may be enabled only in the normal operation mode and may be disabled in the initialization mode.

Figure 19:
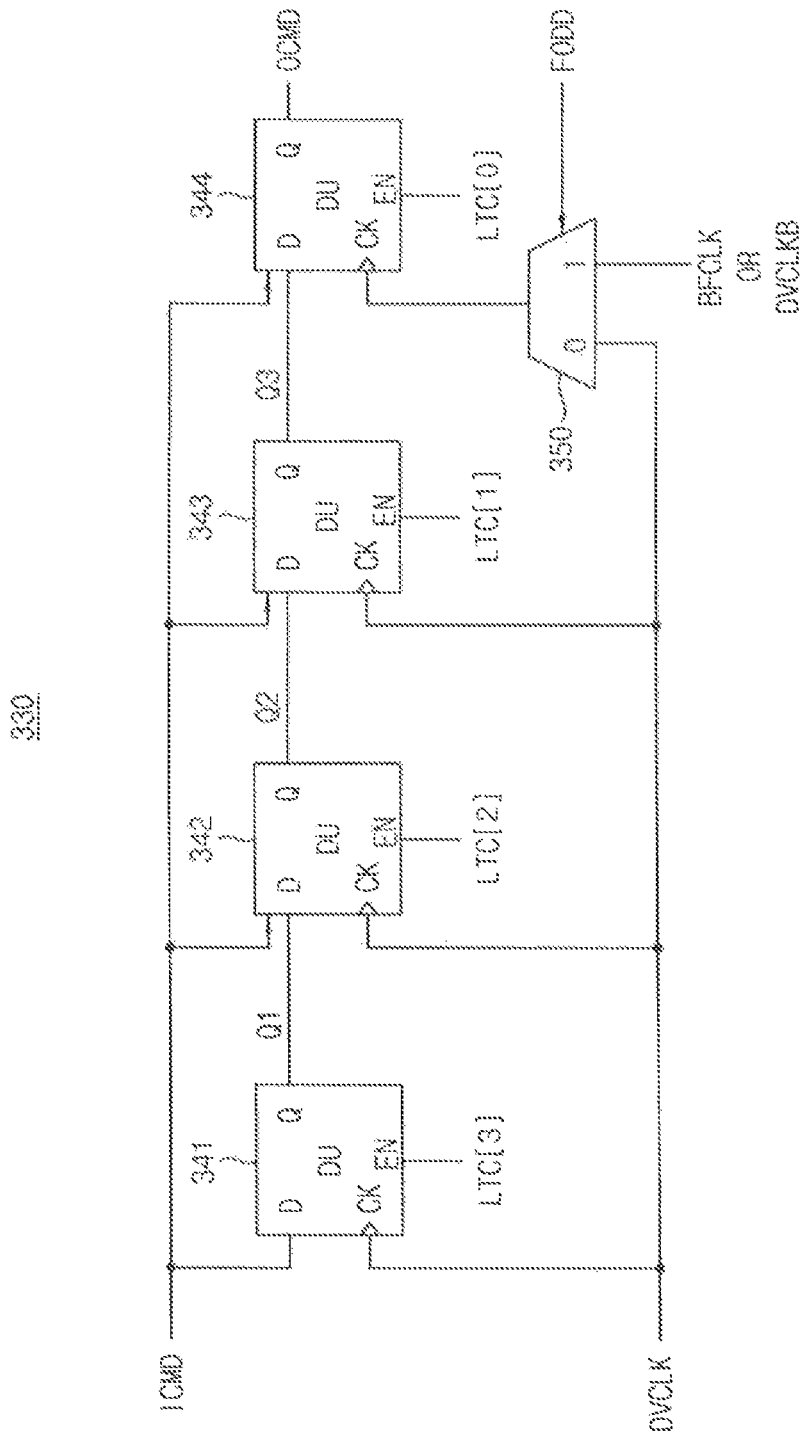
FIG. 19 is a diagram illustrating the latency delay circuit in FIG. 18 according to example embodiments of the inventive concept.

The latency control circuit 310 may generate a latency control signal LTC corresponding to a compensated latency in the normal operation mode. The compensated latency may be calculated by subtracting the loop delay LPDEL from a command latency LCOM. The latency control signal LTC may be implemented with a plurality of bit signal LTC[0]~LTC[3] as illustrated in FIG. 19. For example, when the command latency LCOM is a CAS latency CL and the loop delay LPDEL is M, the compensated latency may be CL-M. Here, CL and M may be represented by positive integers corresponding to the clock cycle number of the source clock signal BFCLK.

In addition, the latency control circuit 310 may generate an odd flag signal FODD indicating whether the compensated latency corresponds to an odd number multiple the clock cycle period tCK of the source clock signal BFCLK or not.

The latency delay circuit 330, as described with reference to FIG. 2, may be disposed on a command path of the memory device 1000 to provide a delay corresponding to the compensated latency based on the latency control signal LTC and the odd flag signal FODD. The latency delay circuit 330 may delay an internal delay signal ICMD by the compensated latency based on the latency control signal LTC and the odd flag signal FODD to generate a compensated command signal OCMD.

In some example embodiments of the inventive concept, the latency control circuit 310 may receive a CAS latency (CL) as the command latency LCOM from the mode register set MRS in FIG. 2 in the read operation to control the latency delay circuit 330 such that the drivers of the data input-output circuit DIO may output the read data to the data pads 33 at a proper timing.

In other example embodiments of the inventive concept, the latency control circuit 310 may receive a CAS write latency (CWL) as the command latency LCOM from the mode register set MRS in FIG. 2 in the write operation to control the latency delay circuit 330 such that the reception buffers of the data input-output circuit DIO may receive the write read data through the data pads 33 at a proper timing.

FIG. 19 is a diagram illustrating an example embodiment of the latency delay circuit in FIG. 18.

Referring to FIG. 19, a latency delay circuit 330 may include a plurality delay unit circuits 341, 342, 343 and 344 and a clock selector 350.

The plurality of delay unit circuits 341, 342, 343 and 344 are connected in series and operates in response to the latency control signal LTC. The serial connection or the cascade connection indicates that an output of a previous stage is provided as an input to a next stage. An delay unit circuit according to an example embodiment of the inventive concept will be described below with reference to FIG. 20. FIG. 19 illustrates a non-limiting example of the four delay unit circuits 341, 342, 343 and 344, and the number of the cascade-connected delay unit circuits may be variously determined.

In some example embodiments, the clock selector 350 may apply one of the source clock signal BFCLK and the divided clock signal DVCLK to a last delay unit circuit 344 of the plurality of delay unit circuits 341, 342, 343 and 344 in response to the odd flag signal FODD. In other example embodiments, the clock selector 350 may apply one of the divided clock signal DVCLK and an inverted-divided clock signal DVCLKB to a last delay unit circuit 344 of the plurality of delay unit circuits 341, 342, 343 and 344 in response to the odd flag signal FODD, where the inverted-divided clock signal DVCLKB is an inversion signal of the divided clock signal DVCLK.

The cascade-connected delay unit circuits 341, 342, 343 and 344 may generate the compensated command signal OCMD by adjusting a latency of the internal command signal ICMD in response to the latency control signal LTC, for example, a plurality of bit signals LTC[0]~LTC[3] that are applied to enable terminals EN of the delay unit circuits 341, 342, 343 and 344.

With respect to each of the delay unit circuits 341, 342, 343 and 344, a data terminal D is connected to an output terminal Q of a previous stage. The output of the clock selector 350 is applied to a clock terminal CK of the last delay unit circuit 344 and the divided clock signal DVCLK is applied to the clock terminal CK of the other delay unit circuits 341, 342 and 343.

Each of the delay unit circuits 341, 342, 343 and 344 may be enabled respectively in response to the corresponding one of the bit signals LTC[0]~LTC[3]. The enabled delay unit circuit may shift the internal command signal ICMD based on the clock signal applied to the clock terminal CK.

Figure 20:
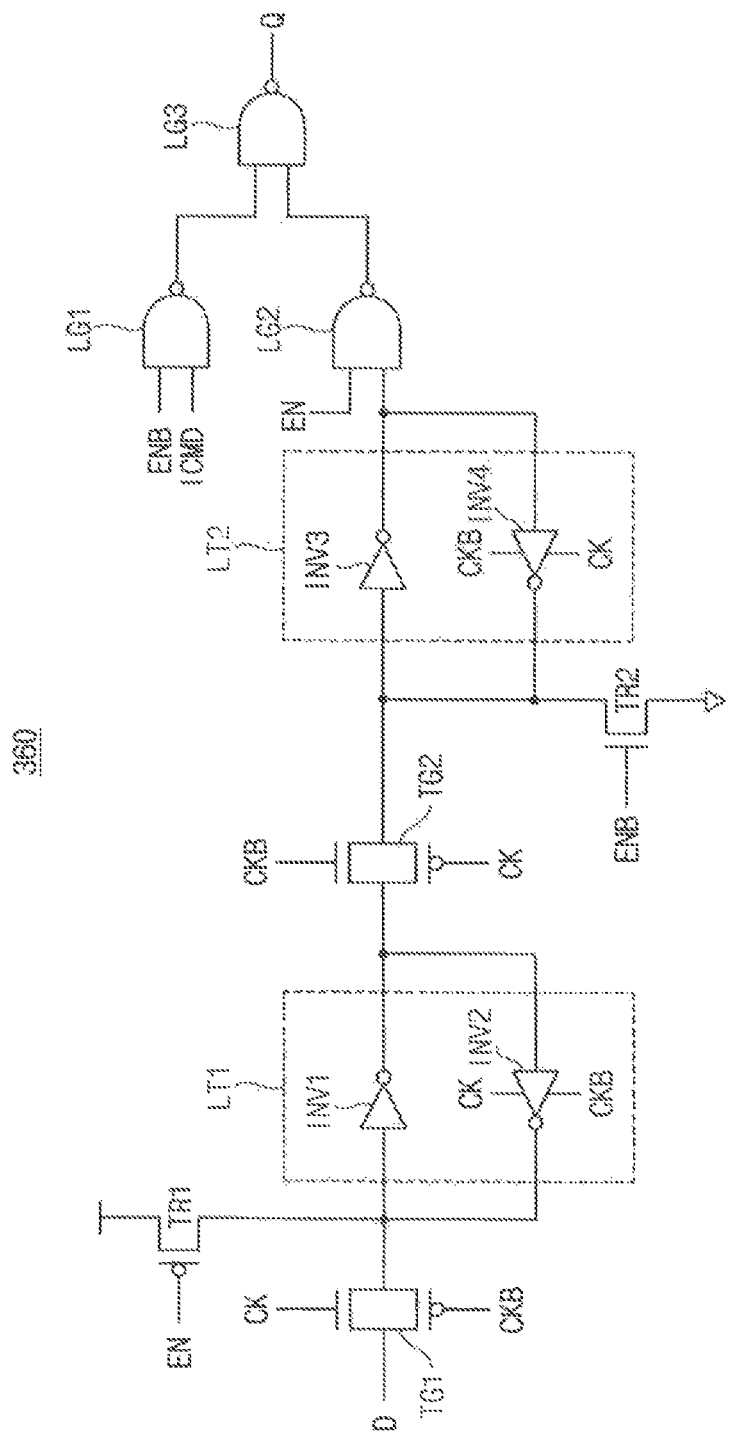
FIG. 20 is a circuit diagram illustrating a delay unit circuit included in the latency delay circuit in FIG. 19 according to example embodiments of the inventive concept.

FIG. 20 is a circuit diagram illustrating an example embodiment of a delay unit circuit included in the latency delay circuit in FIG. 19.

As illustrated in FIG. 20, each delay unit circuit 360 may include transmission gates TG1 and TG2, transistors TR1 and TR2, latches LT1 and LT2 and logic gates LG1, LG2 and LG3. The latches LT1 and LT2 may include inverters INV1~INV4, and some of the inverters INV1~INV4 may be a tri-state inverter operating in response to a clock signal applied to the clock terminal CK. An inversion clock terminal is represented by CKB in FIG. 20.

The first transmission gate TG1 may store a signal at the data terminal D to the first latch LT1 in response to a rising edge of the clock signal at the clock terminal CK. The second transmission gate TG2 may store a value stored in the first latch LT1 to the second latch LT2 in response to a falling edge of the clock signal at the clock terminal CK.

The logic gates LG1, LG2 and LG3 may bypass the internal command signal ICMD to transfer the internal command signal ICMD to the delay unit circuit of the next stage, in response to the deactivated bit signal applied to the enable terminal EN. In contrast, the logic gates LG1, LG2 and LG3 may transfer a value stored in the second latch LT2 to the delay unit circuit of the next stage, in response to the activated bit signal applied to the enable terminal EN. An inversion enable terminal is represented by ENB in FIG. 20.

The transistors TR1 and TR2 may adjust signal levels of the latches LT1 and LT2 in response to the signals applied to the terminals EN and ENB so that the internal command signal ICMD may be bypassed through the logic gates LG1, LG2 and LG3.

Figure 21:
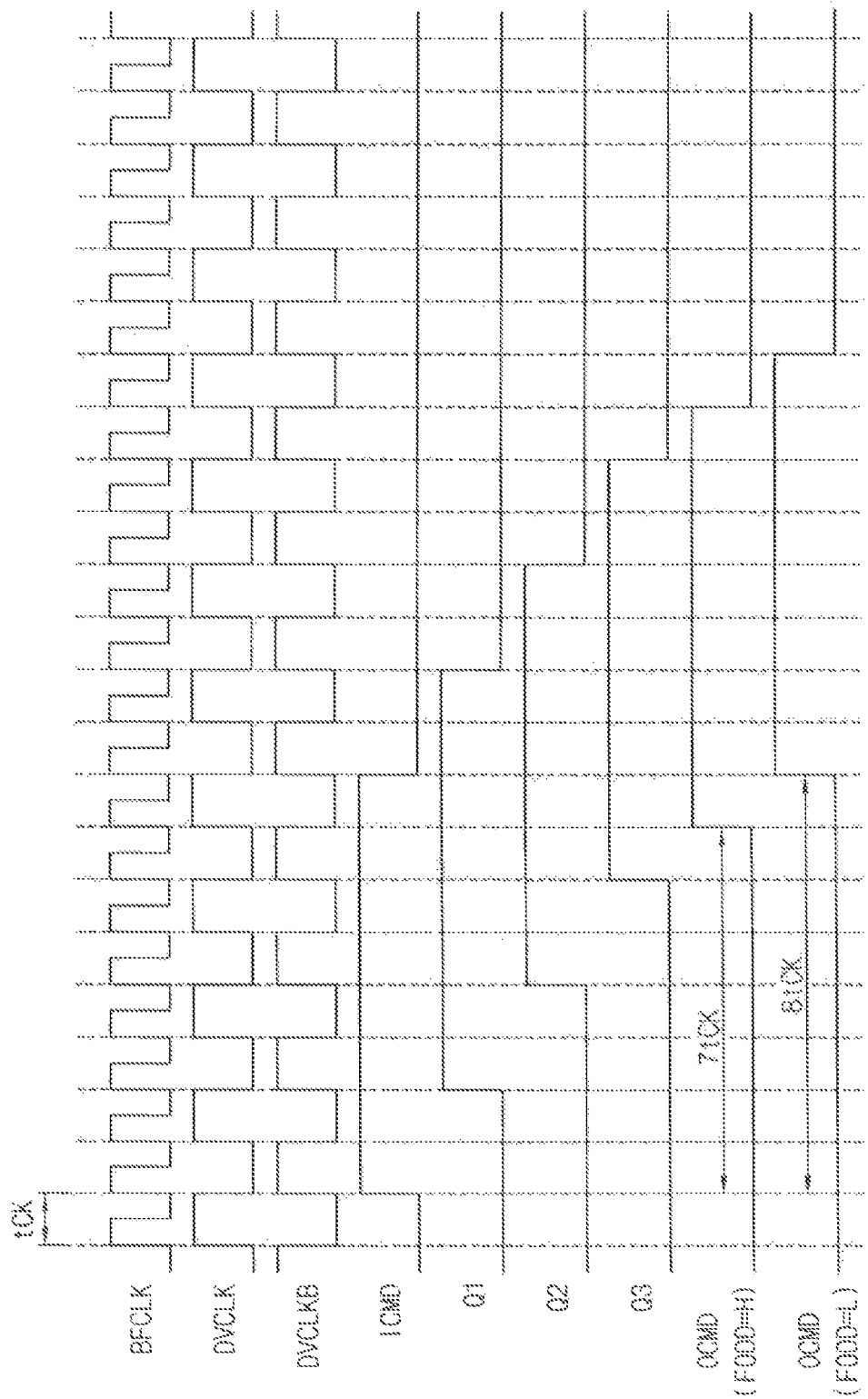
FIG. 21 is a timing diagram illustrating an operation of the latency delay circuit in FIG. 19.

FIG. 21 is a timing diagram illustrating an operation of the latency delay circuit in FIG. 19.

FIG. 21 shows phases of a source clock signal BFCLK having a clock cycle period tCK, a divided clock signal DVCLK, an inverted-divided clock signal DVCLKB, an internal command signal ICMD and output signals Q1, Q2, Q3 and OCMD of the delay unit circuits 341, 342, 343 and 344 in FIG. 19. The output signal of the last delay unit circuit 344 corresponds to the compensated command signal OCMD. FIG. 21 illustrates a case that the all of the bit signals LTC[0]~LTC[3] are activated and thus all of the delay unit circuits 341, 342, 343 and 344 are enabled.

Each of the delay unit circuits 341, 342, 343 and 344 have the delay of 2tCK when they operate in response to the divided clock signal DVCLK and have the delay of tCK when they operate in response to the source clock signal BFCLK.

The clock selector 350 may select the source clock signal BFCLK or the inverted-divided clock signal DVCLKB when the odd flog signal FODD has a first logic level (e.g., a logic high level H) and apply the selected one to the clock terminal CK of the last delay unit circuit 344. In contrast, the clock selector 350 may select the divided clock signal DVCLK when the odd flog signal FODD has a second logic level (e.g., a logic low level L) and apply the selected one to the clock terminal CK of the last delay unit circuit 344. In the example of FIG. 21, the last delay unit circuit 344 has the delay of tCK when the compensated latency is an odd number, and the compensated command signal OCMD may be delayed by 7tCK with respect to the internal command signal ICMD. In contrast, the last delay unit circuit 344 has the delay of 2tCK when the compensated latency is an even number, and the compensated command signal OCMD may be delayed by 8tCK with respect to the internal command signal ICMD.

In conventional schemes, all of the delay unit circuits in the latency delay circuit are configured to operate in response to the source clock signal BFCLK. In this case, when the value of the compensated latency is a natural number, S, the latency delay circuit has to include S delay unit circuits.

In contrast, most of the delay unit circuit in the latency delay circuit may be configured to operate in response to the divided clock signal DVCLK according to example embodiments. In other words, when the value of the compensated latency is a natural number, S, the latency delay circuit may include about S/2 delay unit circuits.

As such, the memory device and the method of operating the memory device according to example embodiments may reduce a size and power consumption of the delay circuit for the latency control by implementing a delay of the command path using the divided clock signal.

Figure 22:
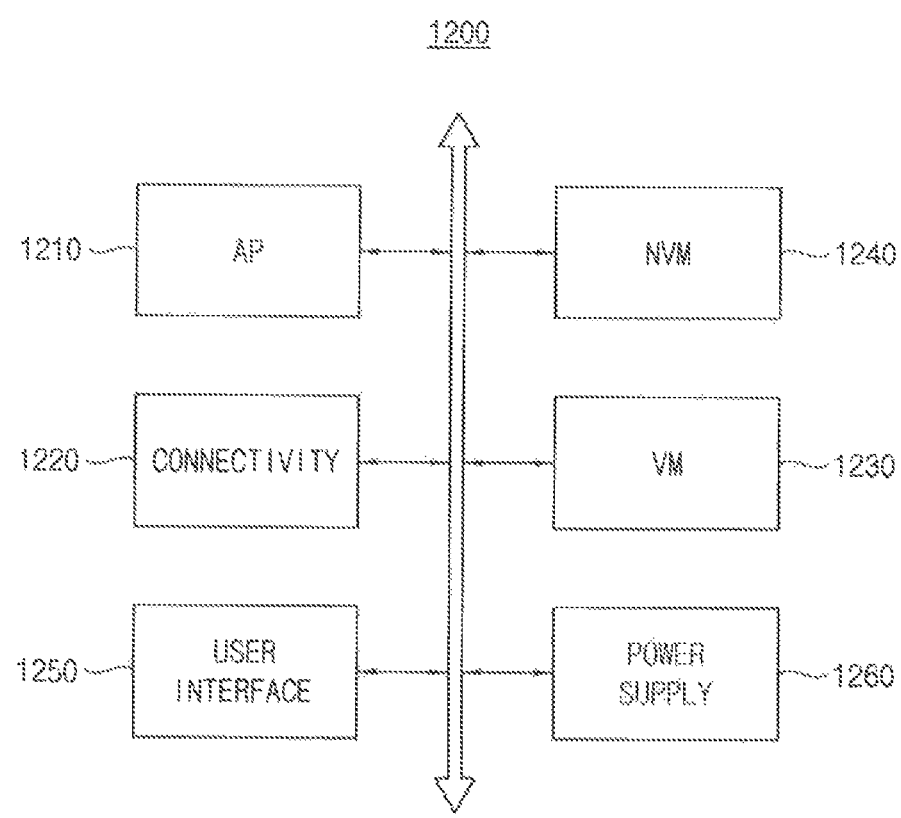
FIG. 22 is a block diagram illustrating a system including a memory device according to example embodiments of the inventive concept.

FIG. 22 is a block diagram illustrating a system including a memory device according to example embodiments.

Referring to FIG. 22, a system 1200 according to an embodiment of the inventive concept may include an application processor 1210, a connectivity unit 1220, a volatile memory device (VM) 1230, a nonvolatile memory device (NVM) 1240, a user interface 1250, and a power supply 1260.

The application processor 1210 may execute applications such as a web browser, a game application, a video player, etc. The connectivity unit 1220 may include a communication interface configured to perform wired (e.g., micro universal serial bus (USB)) or wireless communication (e.g., WiFi, Bluetooth, Bluetooth Low Energy (LE), Near Field Communication (NFC)) with an external device. The volatile memory device 1230 may store data processed by the application processor 1210, or may operate as a working memory. The nonvolatile memory device 1240 may store a boot image for booting the system 1200. The user interface 1250 may include at least one input device, such as a keypad, a touch screen, etc., and at least one output device, such as a speaker, a display device, etc. The power supply 1260 may supply a power supply voltage to the system 1200.

The volatile memory device 1230 and/or the nonvolatile memory device 1240 may have a configuration for latency control as described with reference to FIGS. 1 through 21.

As described above, the memory device and the method of operating the memory device according to example embodiments of the inventive concept may perform the latency control efficiently by measuring the loop delay using the divided clock signal in the initialization mode. In addition, the memory device and the method of operating the memory device according to example embodiments of the inventive concept may reduce a size and power consumption of the delay circuit for the latency control by implementing a delay of the command path using the divided clock signal.

The example embodiments of the inventive concept may be applied to any devices and systems including a stacked structure of semiconductor dies. For example, embodiments of the inventive concept may be applied to systems such as, for example, a mobile phone, a smartphone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments of the inventive concept and is not to be construed as limiting thereof. Although a few example embodiments of the inventive concept have been described, those skilled in the art will readily appreciate that many modifications are possible in the example embodiments without materially departing from the example embodiments of the inventive concept.

What is claimed is:

1. A method of operating a memory device, the method comprising:
    dividing a source clock signal having a first frequency into a divided clock signal for input to a delay-locked loop circuit in an initialization mode, the divided clock signal having a second frequency less than the first frequency of the source clock signal;
    aligning the divided clock signal and a feedback clock signal by performing a locking operation, wherein the feedback clock signal is generated by delaying the divided clock signal through the delay-locked loop circuit; and
    measuring a loop delay of the delay-locked loop circuit after performing the locking operation, the loop delay corresponding to a delay of the feedback clock signal with respect to the divided clock signal.

2. The method of claim 1, wherein performing the locking operation includes:
    aligning the divided clock signal and the feedback clock signal in same phases.

3. The method of claim 2, wherein the loop delay comprises an even number multiple of a clock cycle period of the source clock signal.

4. The method of claim 1, wherein measuring the loop delay includes:
    disabling the divided clock signal during a freezing window time period; and
    counting a number of clock cycles of the feedback clock signal during the freezing window time period.

5. The method of claim 1, wherein the first frequency of the source clock signal is twice the second frequency of the divided clock signal.

6. The method of claim 5, wherein performing the locking operation includes:
    aligning the divided clock signal and the feedback clock signal in same phases or in opposite phases.

7. The method of claim 6, wherein aligning the divided clock signal and the feedback clock signal in opposite phases includes:
    generating an inverted-divided clock signal by inverting the divided clock signal; and
    aligning the inverted-divided clock signal and the feedback clock signal in same phases.

8. The method of claim 6, wherein the loop delay is an even number multiple of a clock cycle period of the source clock signal when the divided clock signal and the feedback clock signal are aligned in the same phases by performing the locking operation.

9. The method of claim 6, wherein the loop delay is an odd number multiple of a clock cycle period of the source clock signal when the divided clock signal and the feedback clock signal are aligned in opposite phases by the locking operation.

10. The method of claim 5, wherein measuring the loop delay includes:
    counting a value of N corresponding to a number of clock cycles of the feedback clock signal during a freezing window time period, the divided clock signal being disabled during the freezing window time period;

determining the loop delay to be a 2N multiple of a clock cycle period of the source dock signal when the divided clock signal and the feedback clock signal are aligned in same phases by the locking operation; and determining the loop delay to be a 2N−1 or a 2N+1 multiple of the clock cycle period of the source clock signal when the divided dock signal and the feedback clock signal are aligned in opposite phases by the locking operation.

11. The method of claim 1, further comprising:
providing the source clock signal as the input to the delay-locked loop circuit in a normal operation mode.

12. The method of claim 11, further comprising:
generating a locked-delayed clock signal for access operations of the memory device, in the normal operation mode, by delaying the source clock signal through the delay-locked loop circuit based on locking information determined in the initialization mode.

13. The method of claim 1, further comprising:
controlling, in a normal operation mode, a delay of a command path of the memory device based on a command latency, the source clock signal, the divided clock signal and the loop delay.

14. The method of claim 13, wherein controlling the delay of the command path includes:
calculating a compensated latency by subtracting a value of the loop delay from a value of the command latency; and
generating an odd flag signal indicating whether the compensated latency corresponds to an odd number multiple of a clock cycle period of the source clock signal.

15. The method of claim 14, wherein the command path includes a plurality of delay unit circuits connected in series to provide a delay corresponding to the compensated latency, and
wherein a last delay unit circuit of the plurality of delay unit circuits receives one of the source clock signal and the divided clock signal, or one of the divided clock signal and an inverted-divided clock signal, in response to the odd flag signal, the inverted-divided clock signal being an inversion signal of the divided clock signal.

16. A method of operating a memory device, the method comprising:
dividing a source clock signal having a first frequency to provide a divided clock signal for input to a delay-locked loop circuit in an initialization mode, the divided clock signal having a second frequency less than the first frequency of the source clock signal;
aligning the divided clock signal and a feedback clock signal by performing a locking operation, wherein the feedback clock signal is generated by delaying the divided clock signal through the delay-locked loop circuit;

measuring a loop delay of the delay-locked loop circuit after the locking operation is completed, the loop delay corresponding to a delay of the feedback clock signal with respect to the divided clock signal; and
controlling a delay of a command path of the memory device based on a command latency, the source clock signal, the divided clock signal and the loop delay in a normal operation mode.

17. The method according to claim 16, wherein an operation margin for measuring the loop delay of the delay-locked loop circuit increases when a frequency of the divided dock signal decreases.

18. A memory device comprising:
a delay-locked loop circuit configured to generate a feedback clock signal and a locked-delayed clock signal by delaying a reference dock signal;
a clock divider circuit configured to divide a source dock signal having a first frequency and to generate a divided clock signal having a second frequency being less than the first frequency;
a clock selector configured to provide the divided dock signal as the reference dock signal in an initialization mode and provide the source dock signal as the reference dock signal in a normal operation mode; and
a delay measurement circuit configured to measure a loop delay of the delay-locked loop circuit after a locking operation of the delay-locked loop circuit is completed in the initialization mode, the loop delay corresponding to a delay of the feedback clock signal with respect to the divided clock signal.

19. The memory device of claim 18, wherein the delay measurement circuit includes:
a counter configured to count a number of clock cycles of the feedback clock signal during a freezing window time period, the divided clock signal being disabled during the freezing window time period; and
a calculator configured to calculate the loop delay based on the number of clock cycles.

20. The memory device of claim 18, further comprising:
a latency control circuit configured to generate a latency control signal corresponding to a compensated latency in the normal operation mode, the compensated latency being calculated by subtracting the loop delay from a command latency and generate an odd flag signal indicating whether the compensated latency corresponds to an odd number multiple of a clock cycle period of the source clock signal; and
a latency delay circuit disposed on a command path of the memory device to provide a delay corresponding to the compensated latency based on the latency control signal and the odd flag signal.

* * * * *